US009664967B2

(12) United States Patent
Nakamura

(10) Patent No.: US 9,664,967 B2
(45) Date of Patent: May 30, 2017

(54) ELECTRO-OPTICAL DEVICE AND ELECTRONIC APPARATUS

(71) Applicant: SEIKO EPSON CORPORATION, Tokyo (JP)

(72) Inventor: Teiichiro Nakamura, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/046,788

(22) Filed: Feb. 18, 2016

(65) Prior Publication Data

US 2016/0282684 A1   Sep. 29, 2016

(30) Foreign Application Priority Data

Mar. 23, 2015   (JP) .................................. 2015-059151

(51) Int. Cl.
*H01L 29/12*       (2006.01)
*G02F 1/1362*      (2006.01)
*H01L 27/12*       (2006.01)

(52) U.S. Cl.
CPC .. *G02F 1/136213* (2013.01); *G02F 1/136209* (2013.01); *H01L 27/124* (2013.01); *H01L 27/1255* (2013.01); *G02F 2201/40* (2013.01)

(58) Field of Classification Search
CPC ......... G02F 1/136209; G02F 1/136213; G02F 2201/40; H01L 27/124; H01L 27/1255
USPC .... 257/71, 72, 435; 349/110, 139, 111, 129, 349/44, 49; 359/315
See application file for complete search history.

(56) References Cited

U.S. PATENT DOCUMENTS

| | | | | |
|---|---|---|---|---|
| 5,861,928 A * | 1/1999 | Sekiguchi | ............. | G02F 1/1365 349/106 |
| 6,297,862 B1 * | 10/2001 | Murade | ............. | G02F 1/136209 349/110 |
| 6,703,997 B2 * | 3/2004 | Murade | ............... | G02F 1/13454 345/87 |
| 6,809,787 B1 * | 10/2004 | Seo | .................... | G02F 1/133707 349/110 |
| 6,885,417 B2 * | 4/2005 | Murade | ............. | G02F 1/136209 349/110 |

(Continued)

FOREIGN PATENT DOCUMENTS

JP    2010-072661 A    4/2010
JP    2013-246358 A    12/2013

*Primary Examiner* — Mohammed Shamsuzzaman
(74) *Attorney, Agent, or Firm* — Oliff PLC

(57) ABSTRACT

In an element substrate of an electro-optical device, a data line on a first metal layer with light shielding properties overlaps a semiconductor layer in a planar view, and a relay electrode on the first metal layer with light shielding properties has an end on the first wire side which extends along the semiconductor layer in the Y direction (first direction) and faces the data line through a first gap. A second metal layer with light shielding properties is formed between the first metal layer and a layer of a pixel electrode, and a first shielding section, which overlaps the first gap in a planar view by a first projection section of a constant potential line, is configured on the second metal layer. Both the first metal layer and the second metal layer include an aluminum layer, have a small electrical resistance and a substantially infinite OD value.

18 Claims, 11 Drawing Sheets

(56) References Cited

U.S. PATENT DOCUMENTS

| | | | | |
|---|---|---|---|---|
| 7,161,592 B2* | 1/2007 | Murade | ............ | G02F 1/136209 257/294 |
| 7,321,406 B2* | 1/2008 | Lee | ................ | G02F 1/136209 349/110 |
| 7,361,934 B2* | 4/2008 | Ishii | ................ | G02F 1/136209 257/59 |
| 7,728,400 B2* | 6/2010 | Nakagawa | ........ | G02F 1/133512 257/435 |
| 8,487,313 B2* | 7/2013 | Kubota | ............... | H01L 51/5228 257/350 |
| 8,896,793 B2* | 11/2014 | Hara | ................ | G02F 1/136277 349/139 |
| 2003/0122158 A1* | 7/2003 | Murade | ............ | G02F 1/136209 257/200 |
| 2003/0234971 A1* | 12/2003 | Murade | ............ | G02F 1/136209 359/315 |
| 2004/0004221 A1* | 1/2004 | Murade | ............ | H01L 29/78609 257/72 |
| 2004/0135940 A1* | 7/2004 | Tsunekawa | ........ | G02F 1/136209 349/110 |
| 2004/0135952 A1* | 7/2004 | Kurashina | ......... | G02F 1/136227 349/139 |
| 2012/0319978 A1* | 12/2012 | Takeuchi | ............ | G02F 1/13338 345/173 |

* cited by examiner

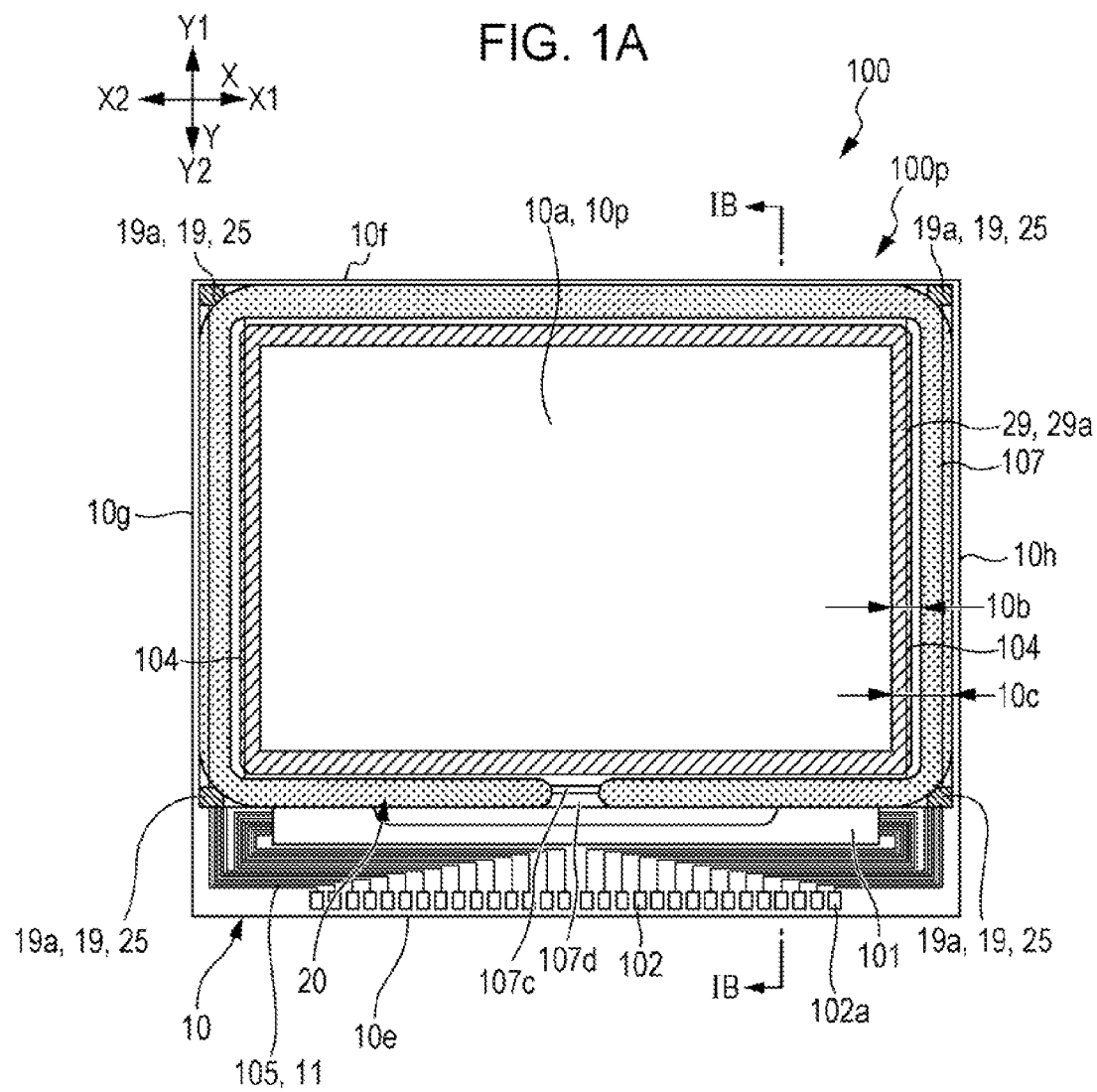
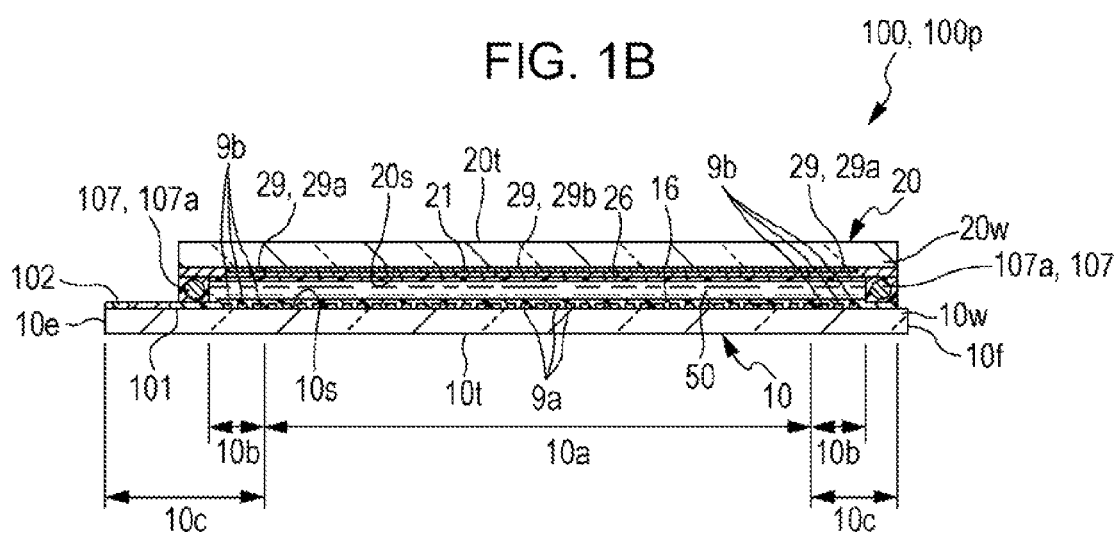

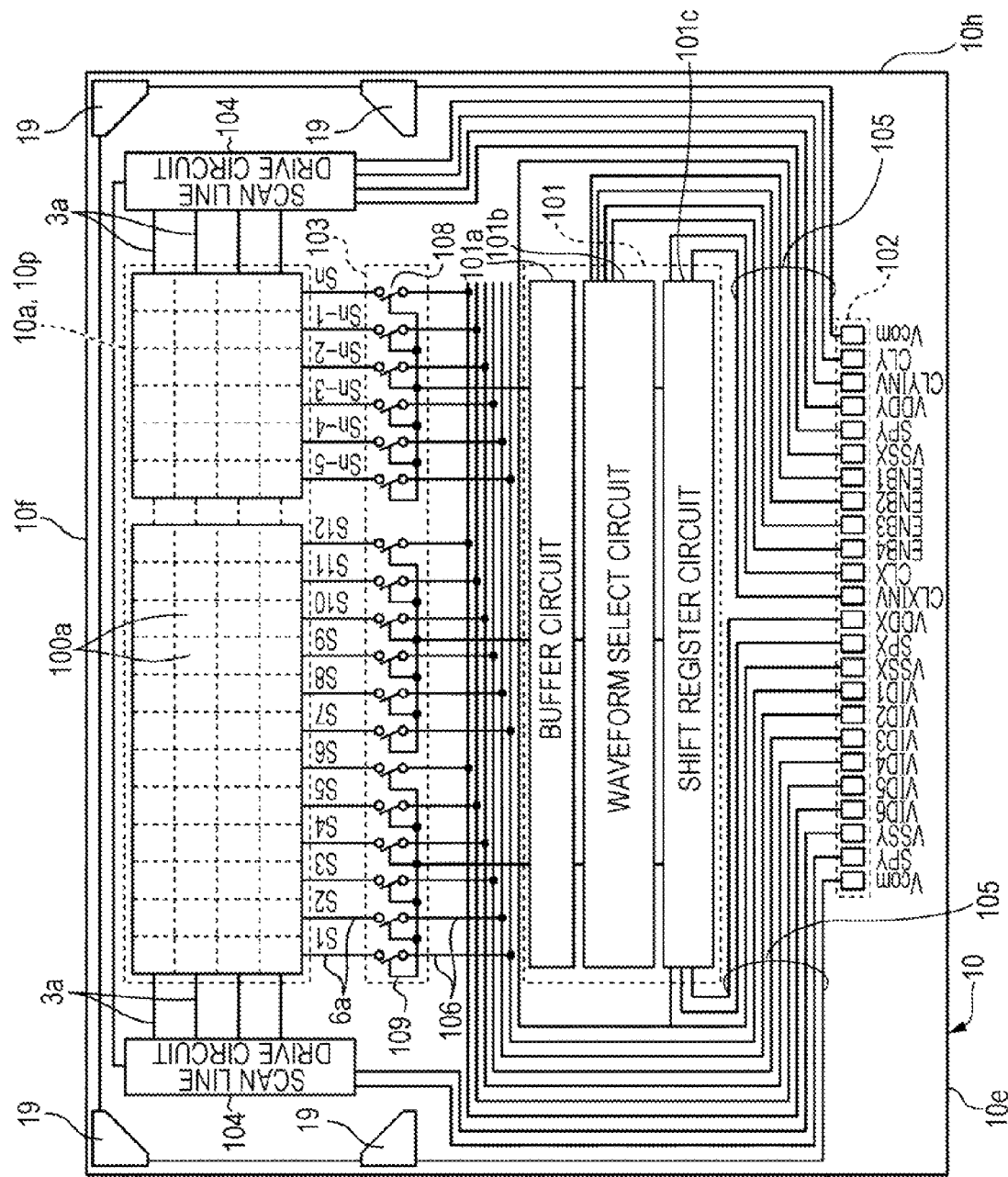
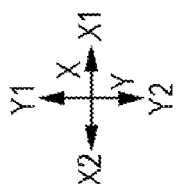
FIG. 2A

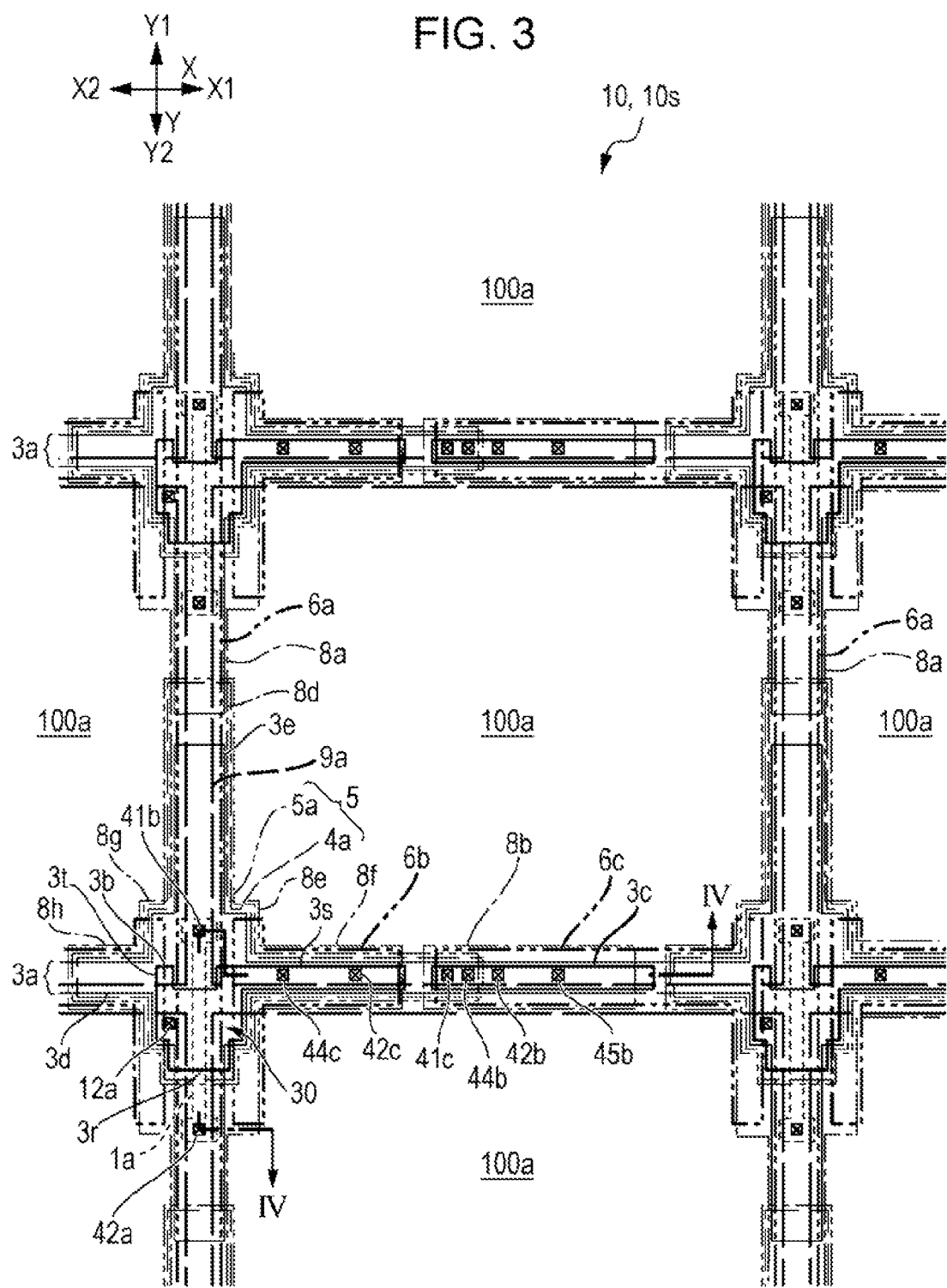

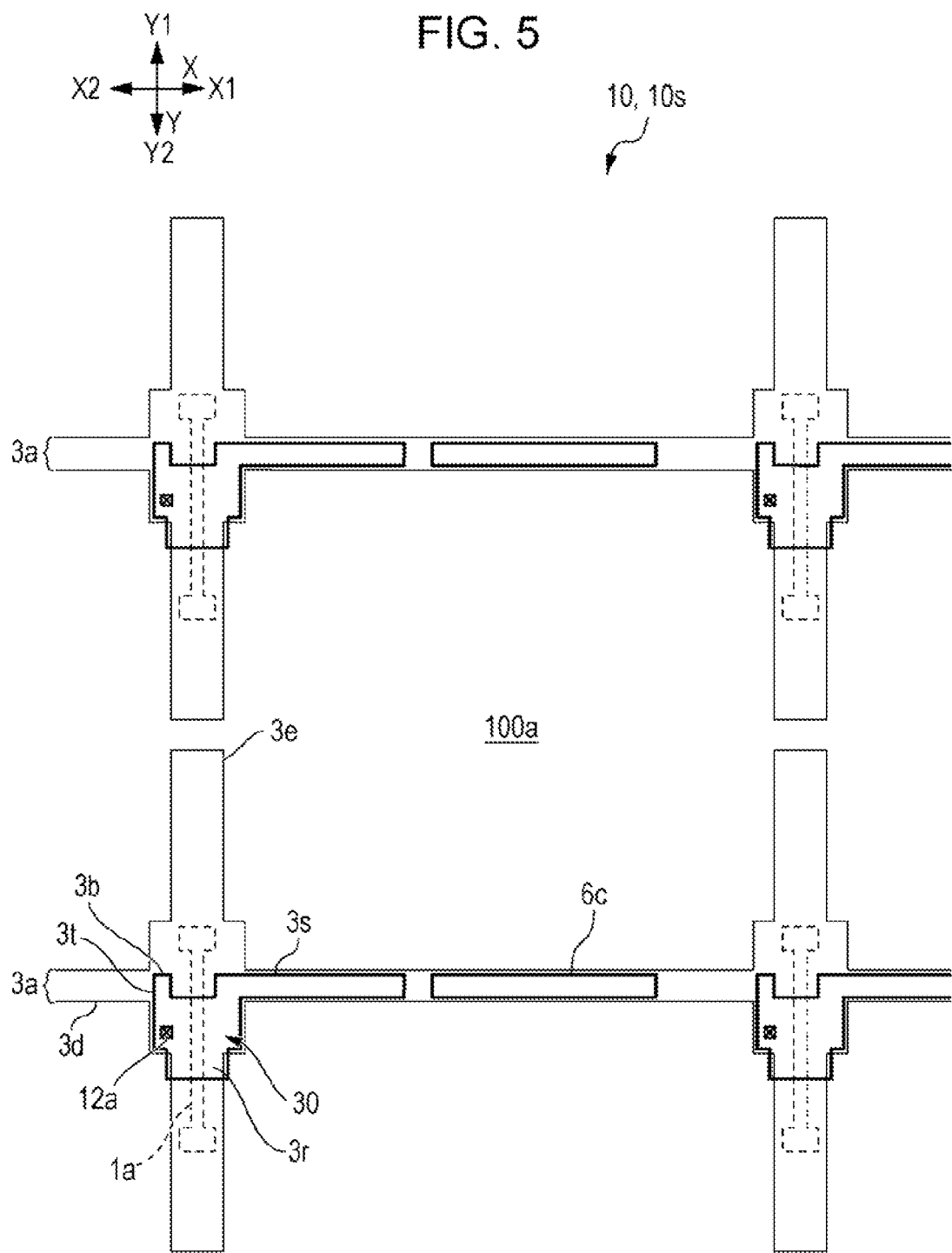

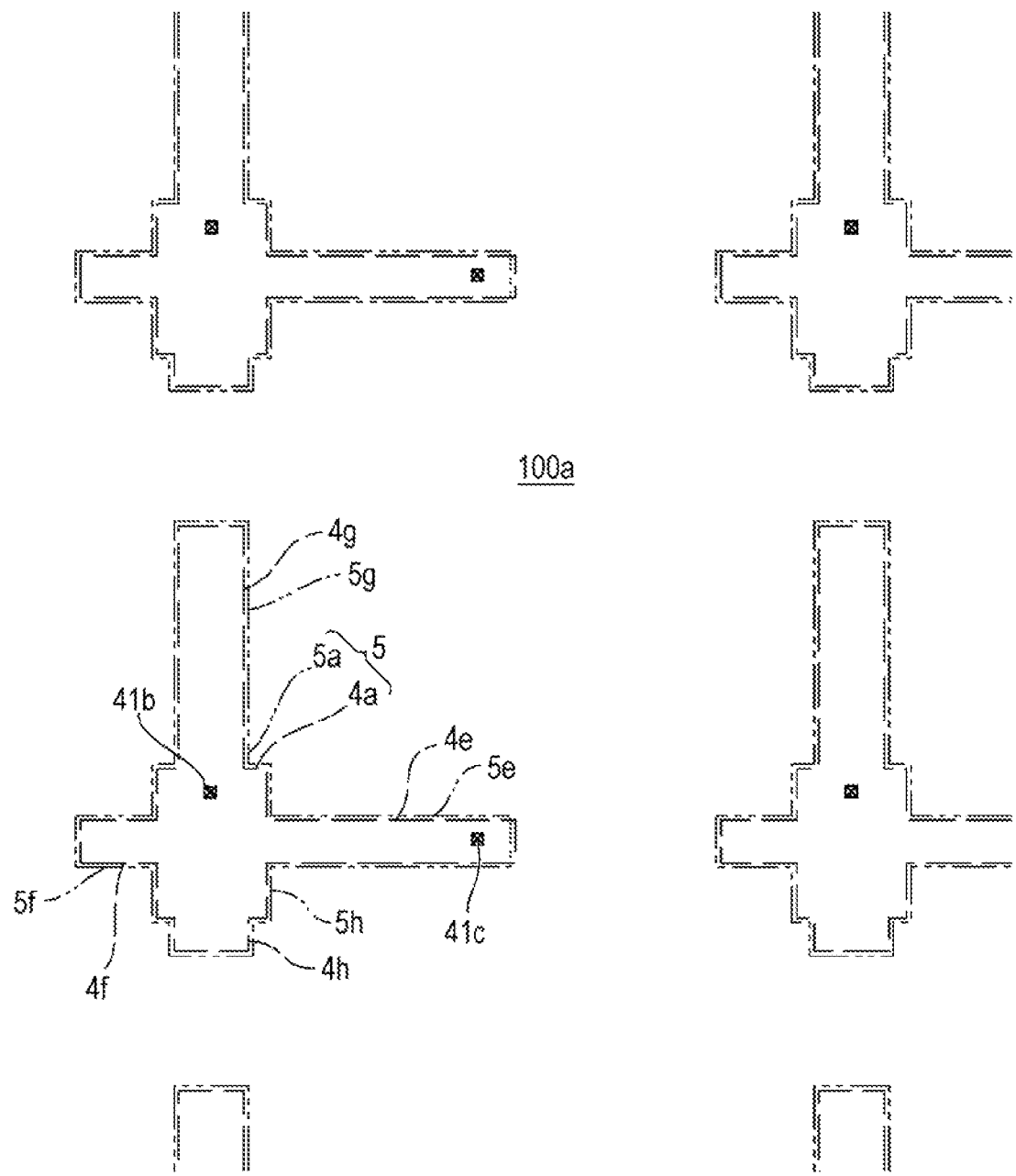

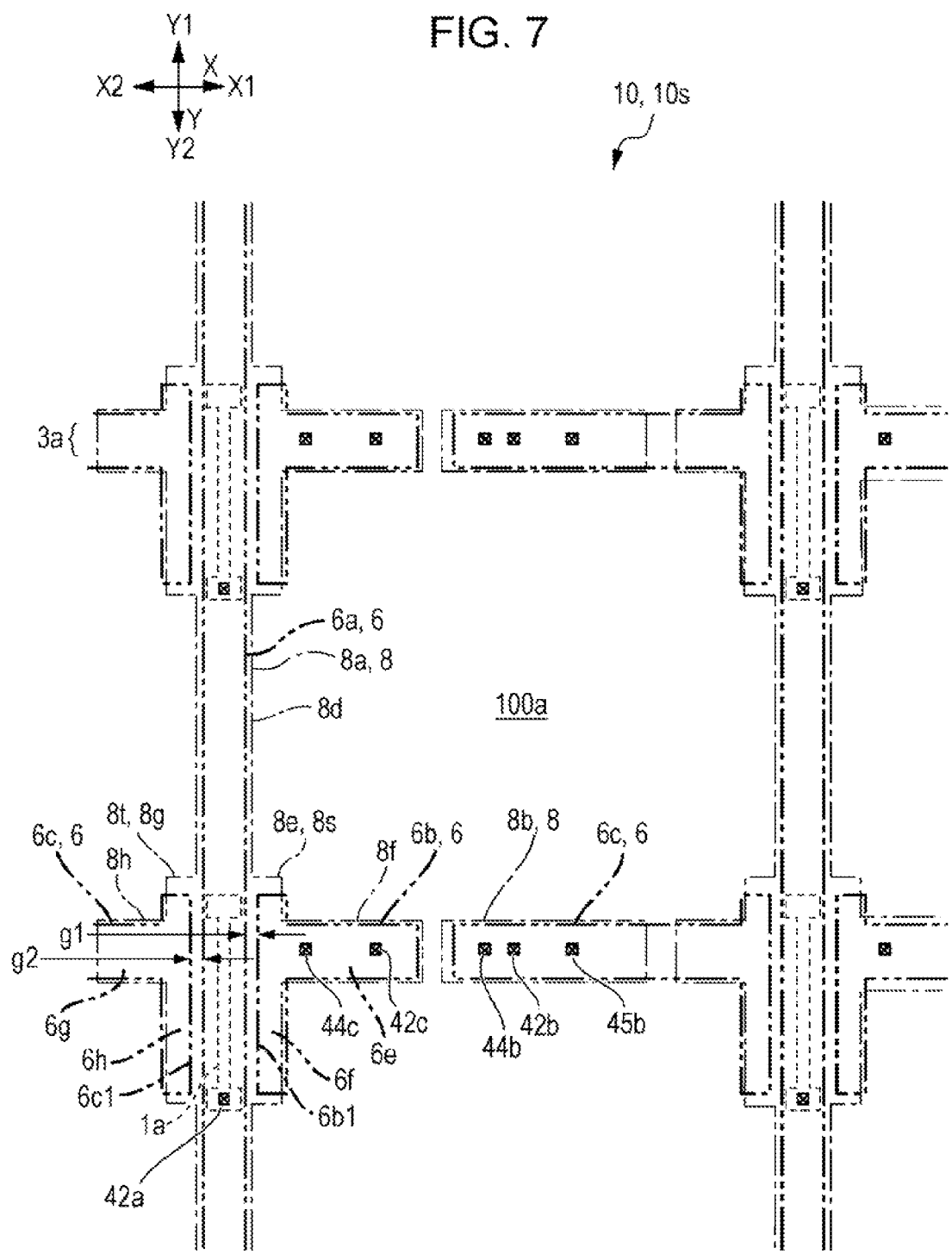

ELECTRO-OPTICAL DEVICE AND ELECTRONIC APPARATUS

BACKGROUND

1. Technical Field

The present invention relates to an electro-optical device in which a pixel transistor, a pixel electrode, and the like are provided on a substrate, and an electronic apparatus including the electro-optical device.

2. Related Art

In an electro-optical device such as a liquid crystal device, a pixel transistor, a wire such as a data line, and a pixel electrode are provided on one side of an element substrate, the pixel transistor is turned on during a select period, and thereby an image signal is supplied to the pixel electrode from the data line through the pixel transistor. The electro-optical device requires bright displaying which is obtained by widening a pixel opening area of each pixel through which light passes. If illumination light is incident on a semiconductor layer which configures a pixel transistor, a light leakage current is generated on one side thereof, and thereby flicker or the like occurs.

Therefore, a technology, in which illumination light incident on a semiconductor layer by a light shielding layer of a lattice shape that is provided between a layer of a data line and a layer of a pixel electrode is suppressed on an element substrate, is proposed (JP-A-2010-72661).

However, as disclosed in JP-A-2010-72661, if the light shielding layer is used between a layer of the data line and a layer of the pixel electrode, the semiconductor layer is separated from the light shielding layer. For this reason, in order to shield light which travels in a tilted direction toward the semiconductor layer, it is necessary to widen a width of the light shielding layer, and thereby a pixel opening is narrowed.

SUMMARY

An advantage of some aspects of the invention is to provide an electro-optical device which can efficiently shield light that travels in a tilted direction toward a semiconductor layer, and an electronic apparatus.

An electro-optical device according to an aspect of the invention includes a substrate; a pixel transistor which includes a semiconductor layer extending toward one side of the substrate in a first direction; a pixel electrode which is provided on a side opposite to the substrate with respect to the semiconductor layer and is electrically coupled to an end on the one side of the semiconductor layer; a first metal layer with light shielding properties which includes a first wire that extends in the first direction and overlaps the semiconductor layer in a planar view, and a first relay electrode that is separated from one side of a second direction that intersects the first direction from the first wire, and which is provided between a layer of the pixel transistor and a layer of the pixel electrode; and a second metal layer with light shielding properties which includes a second wire that extends in at least one direction of the first direction and the second direction, and is provided between the first metal layer and a layer of the pixel electrode, in which the first relay electrode has an end on the other side of the second direction that is separated from the first wire by a first gap and extends along the semiconductor layer in the first direction, and in which the second metal layer includes a first light shielding section that overlaps the first gap in a planar view.

In this case, the first wire on the first metal layer overlaps the semiconductor layer in a planar view. The end on the other side of the second direction of the first relay electrode on the first metal layer is separated from the first wire by the first gap, and extends along the semiconductor layer in the first direction. In addition, the first metal layer is closer to the semiconductor layer than the second metal layer. For this reason, it is possible for the first relay electrode to prevent light which travels from a tilted direction toward the one side of the second direction from reaching the semiconductor layer. Here, since different potentials are applied to the first wire and the first relay electrode, it is necessary to form a width of the first gap at a quite sufficient dimension, but even in this case, the first light shielding section of the second metal layer overlaps the first gap in a planar view. For this reason, it is possible to reliably prevent the light which travels from a tilted direction toward the one side of the second direction from reaching the semiconductor layer. Therefore, it is possible to prevent flicker or the like from occurring due to a light leakage current.

In the device according to the aspect of the invention, it is preferable that the first relay electrode includes a first main body section which extends in the second direction, and a first protrusion section which protrudes along the semiconductor layer in the first direction from the end on the other side of the second direction of the first main body section. According to the configuration, the first protrusion section extends along the semiconductor layer, and thus, it is possible to form a wider pixel opening, compared to a case in which the entire first relay electrode extends in the first direction.

In the device according to the aspect of the invention, it is preferable that the second wire extends in the first direction and overlaps the first wire in a planar view, and the first light shielding section includes a first projection section which projects toward the one side of the second direction from the second wire. According to the configuration, it is possible to realize a configuration in which the second metal layer overlaps the first gap in a planar view, using a simple configuration.

In the device according to the aspect of the invention, it is preferable that the first metal layer includes a second relay electrode which is separated from the first wire toward the other side of the second direction, the second relay electrode has an end on the one side of the second direction which is separated from the first wire by a second gap and extends along the semiconductor layer in the first direction, and the second metal layer includes a second light shielding section which overlaps the second gap in a planar view. According to the configuration, it is possible to reliably prevent the light which travels from a tilted direction toward the other side of the second direction from reaching the semiconductor layer.

In the device according to the aspect of the invention, it is preferable that the second relay electrode includes a second main body section which extends in the second direction, and a second protrusion section which protrudes along the semiconductor layer in the first direction from the end on the one side of the second direction of the second main body. According to the configuration, the second protrusion section extends along the semiconductor layer, and thus, it is possible to form a wider pixel opening, compared to a case in which the entire second relay electrode extends in the second direction.

In the device according to the aspect of the invention, it is preferable that the second wire extends in the first direction and overlaps the first wire in a planar view, and the second light shielding section includes a second projection section which projects toward the other side of the second direction from the second wire. According to the configuration, it is possible to realize a configuration in which the second metal layer overlaps the second gap in a planar view, using a simple configuration.

In the device according to the aspect of the invention, it is possible to employ an aspect in which the first wire is a data line that is electrically coupled to the end on the other side of the semiconductor layer.

In the device according to the aspect of the invention, it is preferable that both the first metal layer and the second metal layer include an aluminum layer. According to the aluminum layer, an electrical resistance is small, and an optical density (OD) value can be set to a substantially infinite value.

In the device according to the aspect of the invention, it is preferable that a retention capacitor which is electrically coupled to the pixel electrode is provided between the semiconductor layer and the first metal layer, and an electrode which configures the retention capacitor overlaps the semiconductor layer in a planar view. According to the configuration, it is also possible for an electrode which configures the retention capacitor to prevent the light from being incident on the semiconductor layer.

The electro-optical device according to the aspect of the invention can be used for an electronic apparatus such as a cellular phone, a mobile computer, or a projection type display device. A projection type display device among the electronic apparatuses includes a light source unit which supplies light to an electro-optical device, and a projection optical system which projects light modulated by the electro-optical device.

BRIEF DESCRIPTION OF THE DRAWINGS

The invention will be described with reference to the accompanying drawings, wherein like numbers reference like elements.

FIGS. 1A and 1B are explanatory views of a liquid crystal panel of an electro-optical device which employs the invention.

FIGS. 2A and 2B are explanatory views illustrating an electrical configuration of an element substrate of the electro-optical device which employs the invention.

FIG. 3 is a plan view of a plurality of pixels adjacent to each other in the element substrate of the electro-optical device which employs the invention.

FIG. 5 is a plan view of a gate electrode or the like which configures a pixel transistor in the element substrate of the electro-optical device that employs the invention.

FIG. 6 is a plan view of a retention capacitor electrode which configures a retention capacitor in the element substrate of the electro-optical device that employs the invention.

FIG. 7 is a plan view of a data line, a constant potential line, or the like which is formed on the element substrate of the electro-optical device that employs the invention.

DESCRIPTION OF EXEMPLARY EMBODIMENTS

Figure 2B:
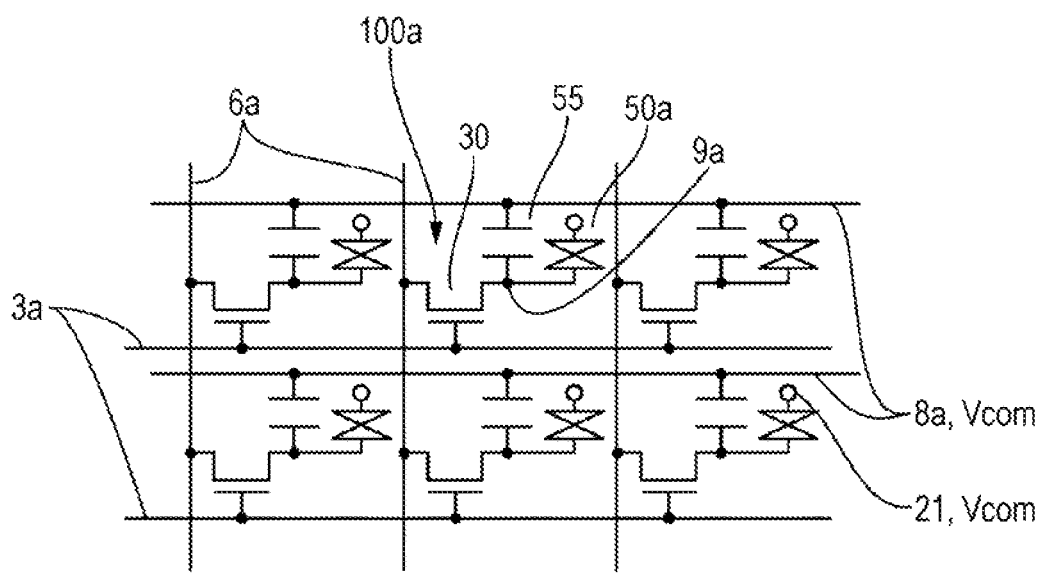

Hereinafter, as embodiments of the invention, a liquid crystal device which is a representative electro-optical device will be described. In the figures referred to in the following description, in order to set each layer or each member to a size which can be recognized in the figures, a dimension is set differently from each other in each layer or each member. In addition, in the figures referred to in the following description, the number of lines such as scan lines, data lines, and signal lines, or the like is illustrated to be less than actual.

FIGS. 1A and 1B are explanatory views of a liquid crystal panel of an electro-optical device which employs the invention. FIG. 1A is a plan view of the liquid crystal panel and each configuration element which is viewed from a counter substrate side, and FIG. 1B is a sectional view taken along line IB-IB in the electro-optical device.

As illustrated in FIGS. 1A and 1B, the electro-optical device 100 according to the present embodiment is a liquid crystal device, and includes a liquid crystal panel 100p. In the liquid crystal panel 100p, an element substrate 10 and a counter substrate 20 are bonded by a seal material 107 through a gap, and the seal material 107 is provided in a frame shape along an outer edge of the counter substrate 20. The seal material 107 is an adhesive formed of a photocurable resin, a thermosetting resin, or the like, and is mixed with a gap material 107a such as a glass fiber or glass beads, such that a distance between the two substrates are set to a predetermined value. In the liquid crystal panel 100p, a liquid crystal layer 50 (electro-optical layer) which is formed of various type liquid crystal materials (electro-optical materials) is provided, between the element substrate 10 and the counter substrate 20, within an area surrounded by the seal material 107. In the present embodiment, in the seal material 107, an interrupted portion is formed as a liquid crystal injection hole 107c, and the liquid crystal injection hole 107c is sealed by a sealing material 107d after a liquid crystal material is injected.

In the liquid crystal panel 100p, the element substrate 10 and the counter substrate 20 are both quadrangular in shape, and the element substrate 10 includes two side surfaces 10e and 10f (end sections) facing each other in the Y direction (second direction) and two sides 10g and 10h (end sections) facing each other in the X direction (first direction). In approximately the center of the liquid crystal panel 100p, a display region 10a is provided as an area of a quadrangle, and the seal material 107 is also substantially quadrangular corresponding to the shape. An outer side of the display region 10a is formed of an outer peripheral region 10c of a quadrangular frame shape.

In the outer peripheral region 10c in the element substrate 10, a data line drive circuit 101 and a plurality of terminals 102 are formed along a side surface 10e positioned on one side in the Y axis direction in the element substrate 10, and a scan line drive circuit 104 is formed along each of the other sides 10g and 10h adjacent to the side surface 10e. A flexible wiring substrate (not illustrated) is connected to the terminal 102, and various potentials and various signals are input to the element substrate 10 from an external control circuit through the flexible wiring substrate.

Description will be made later with reference to FIG. 3, but on the one surface 10s side facing the counter substrate 20, among one surface 10s and the other surface 10t of the element substrate 10, pixel electrodes 9a, pixel transistors 30 which will be described later with reference to FIGS. 2A and 2B or the like, and the like are arranged in a matrix form in the display region 10a. Thus, the display region 10a is configured as a pixel electrode arrangement region 10p in which the pixel electrodes 9a are arranged in a matrix form. In the element substrate 10 having such a configuration, an alignment film 16 is formed on an upper layer side of the pixel electrode 9a.

On the one surface 10s side of the element substrate 10, in the outer peripheral region 10c on the outside of the display region 10a, dummy pixel electrodes 9b which are simultaneously formed with the pixel electrodes 9a are formed in a peripheral region 10b of a quadrangular frame shape interposed between the display region 10a and the seal material 107.

The common electrode 21 is formed on one surface 20s side, which faces the element substrate 10, among the one surface 20s and the other surface 20t of the counter substrate 20. In the present embodiment, a common electrode 21 is formed across approximately the entire surface of the counter substrate 20.

In the one surface 20s side of the counter substrate 20, a light shielding layer 29 is formed on a lower layer side of the common electrode 21, and an alignment film 26 is laminated on the surface of the common electrode 21. The light shielding layer 29 is formed as a frame section 29a extending along an outer peripheral edge of the display region 10a, and the display region 10a is specified by an inner peripheral edge of the light shielding layer 29. The light shielding layer 29 is formed also as a black matrix section 29b which overlaps an inter-pixel area interposed between the pixel electrodes 9a adjacent to each other. The frame section 29a is formed in a position which overlaps the dummy pixel electrode 9b, and the outer peripheral edge of the frame section 29a is positioned in a place in which a gap is formed between the inner peripheral edge of the seal material 107 and the outer peripheral edge of the frame section 29a. Thus, the frame section 29a and the seal material 107 do not overlap each other.

In the liquid crystal panel 100p, on the outside of the seal material 107, the inter-substrate conduction electrodes 25 are formed in four corners on the one surface 20s side of the counter substrate 20, and the inter-substrate conduction electrodes 19 are formed in positions facing four corners (inter-substrate conduction electrodes 25) of the counter substrate 20, on the one surface 10s side of the element substrate 10. In the present embodiment, the inter-substrate conduction electrode 25 becomes a portion of the common electrode 21. The common potential Vcom is applied to the inter-substrate conduction electrode 19. An inter-substrate conduction material 19a including conductive particles is disposed between the inter-substrate conduction electrode 19 and the inter-substrate conduction electrode 25, and the common electrode 21 of the counter substrate 20 are electrically connected to the element substrate 10 through the inter-substrate conduction electrode 19, the inter-substrate conduction material 19a, and the inter-substrate conduction electrode 25. For this reason, a common potential Vcom is applied to the common electrode 21 from the element substrate 10 side. The seal material 107 is provided along the outer peripheral edge of the counter substrate 20, with approximately the same width dimension, but an area which overlaps the corner of the counter substrate 20 is provided so as to avoid the inter-substrate conduction electrodes 19 and 25 and pass through an inner side.

In the present embodiment, the electro-optical device 100 is a transmission type liquid crystal device, and the pixel electrode 9a and the common electrode 21 are formed by a light transmitting conductive film, such as an Indium Tin Oxide (ITO) film or an Indium Zinc Oxide (IZO) film. In the transmission type liquid crystal device (electro-optical device 100), light which is incident from the counter substrate 20 side is modulated while being emitted from the element substrate 10, and an image is displayed.

The electro-optical device 100 can be used as a color display device of an electronic apparatus, such as a mobile computer, or a mobile phone, and in this case, a color filter (not illustrated) is formed in the counter substrate 20. In addition, the electro-optical device 100 can be used as an electronic paper. In addition, in the electro-optical device 100, a Polaroid film, a phase difference film, a polarizing plate, and the like are disposed in a predetermined direction with respect to the liquid crystal panel 100p, according to a type of the liquid crystal layer 50 to be used, or a normally white mode and a normally black mode. Furthermore, the electro-optical device 100 can be used as a light valve for RGB for a projection type display device (liquid crystal projector) which will be described later. In this case, light of each color which is decomposed through a dichotic mirror for RGB color decomposition is respectively incident into each of the electro-optical devices 100 for RGB, as projected light, and thus a color filter is not formed in each of the electro-optical device 100 for RGB.

Electrical Configuration of Element Substrate 10

FIGS. 2A and 2B are explanatory diagrams illustrating an electrical configuration of the element substrate 10 of the electro-optical device 100 which employs the invention, and FIG. 2A is an explanatory diagram illustrating a circuit or a plan layout of wires of the element substrate 10 and FIG. 2B is an explanatory diagram illustrating an electrical configuration of pixels. In the following description, for names of signals which are input to the element substrate 10 through the terminals 102, and wires for the signals, the same alphabet symbols are given to rear of the signals and wires L. For example, "clock signal line LCLX is given to a wire for a signal corresponding to "clock signal CLX" which is a signal name. In addition, in the following description, for names of the signals which are input to the element substrate 10 through the terminal 102, and terminals for the signals, the same alphabet symbols are respectively given to the rear of the signals and terminals T. For example, "terminal TCLX" is given to the terminal 102 corresponding to "clock signal CLX" which is a signal name.

As illustrated in FIGS. 2A and 2B, in the electro-optical device 100, the pixel electrode arrangement region 10p in which a plurality of pixels 100a is arranged in a matrix form is provided in the center of the element substrate 10, and an area surrounded by an inner edge of the frame section 29a illustrated in FIG. 1B is the display region 10a, in the pixel electrode arrangement region 10p. In the element substrate 10, a plurality of scan lines 3a extending in the X direction and a plurality of data lines 6a extending in the Y direction are formed inside the pixel electrode arrangement region 10p, and the pixels 100a are configured in positions corresponding to the intersections. In each of a plurality of pixels 100a, the pixel transistor (switching element) 30 configured by a TFT or the like, and the pixel electrode 9a are formed. The data line 6a is electrically connected to a source of the pixel transistor 30, the scan line 3a is electrically connected to a gate of the pixel transistor 30, and the pixel electrode 9a is electrically connected to a drain of the pixel transistor 30.

In the element substrate 10, the scan line drive circuit 104, the data line drive circuit 101, the sampling circuit 103, the inter-substrate conduction electrode 19, the terminal 102, and the like are configured in the outer peripheral region 10c of the outside of the pixel electrode arrangement region 10p. A plurality of wires 105 extends from the terminals 102 toward the scan line drive circuit 104, the data line drive circuit 101, the sampling circuit 103, and the inter-substrate conduction electrode 19.

In each pixel 100a, the pixel electrode 9a faces the common electrode 21 formed in the counter substrate 20 described with reference to FIGS. 1A and 1B, through liquid crystal layer 50, and configures a liquid crystal capacitor 50a. In addition, in order to prevent an image signal retained in the liquid crystal capacitor 50a from varying, a retention capacitor 55 is added in parallel to the liquid crystal capacitor 50a in each pixel 100a. In the present embodiment, in order to configure the retention capacitor 55, a constant potential line (capacitor line) 8a extending over the plurality of pixels 100a is formed, and a common potential Vcom is applied to the constant potential line 8a.

In FIG. 2B, it is illustrated that the constant potential line 8a extends in parallel with the scan line 3a, but the constant potential line 8a may extend in parallel with the data line 6a. The present embodiment employs a configuration in which the constant potential line 8a extends in parallel with the data line 6a.

The terminals 102 provided along a side surface 10e of the element substrate 10 are configured by a plurality of terminal groups which are broadly classified into four purposes of a common potential line purpose, a scan line drive circuit purpose, a pixel signal purpose, and a data line drive circuit purpose.

The data line drive circuit 101 includes a shift register circuit 101c, a waveform select circuit 101b, and a buffer circuit 101a. In the data line drive circuit 101, the shift register circuit 101c starts a transfer operation on the basis of a start signal SPX, and sequentially outputs transfer signals to the waveform select circuit 101b through the buffer circuit 101a at a predetermined timing. The waveform select circuit 101b is referred to as an "enable circuit", limits a pulse width of the transfer signal to a pulse width of the enable signals ENB1 to ENB4, and thereby a sampling period of the sampling circuit 103 is defined.

The sampling circuit 103 is configured to include a plurality of switching elements 108 for sampling an image signal. In the present embodiment, the switching element 108 is configured by a field effect transistor such as a TFT. The data lines 6a are electrically connected to drains of the switching element 108, wires 105 (image signal lines LVID1 to LVID6) are connected to sources of the switching element 108 through wires 106, and select signal lines 109 connected to the data line drive circuit 101 are connected to gates of the switching element 108.

Image signals VID1 to VID6 are sampled by the sampling circuit 103, based on the select signals (sampling circuit driving signals) which are supplied from the data line drive circuit 101 through the select signal line 109, and are supplied to each data line 6a as image signals S1, S2, S3, . . . , Sn. In the present embodiment, the image signals S1, S2, S3, . . . , Sn correspond to each of the image signals VID1 to VIDE in which serial-parallel deployment is performed in six phases, and are supplied for each group with respect to a set of six data lines 6a. The number of the image signals whose phases are deployed is not limited to six phases, and for example, image signals which are deployed in multiple phases such as nine phases, twelve phases, twenty-four phases, or forty-eight phases are supplied to a set of data lines 6a in which numbers corresponding to the number of the deployments are set as a set.

The scan line drive circuit 104 includes a shift register circuit and a buffer circuit as configuration elements, starts the transfer operation of the embedded shift register circuit thereof in response to a start signal SPY, and applies the scan signals to the scan lines 3a in a pulsed manner and a line sequential manner at a predetermined timing, based on a clock signal CLY and a reverse phase clock signal CLYINV.

The wires 105 (common potential line LVcom) is formed in the element substrate 10, so as to pass through four inter-substrate conduction electrodes 19, and the common potential Vcom is supplied to the inter-substrate conduction electrodes 19 through the terminals 102 (terminal TVcom) and the wires 105 (common potential line LVcom).

Specific Configuration of Pixel 100p

Figure 4:
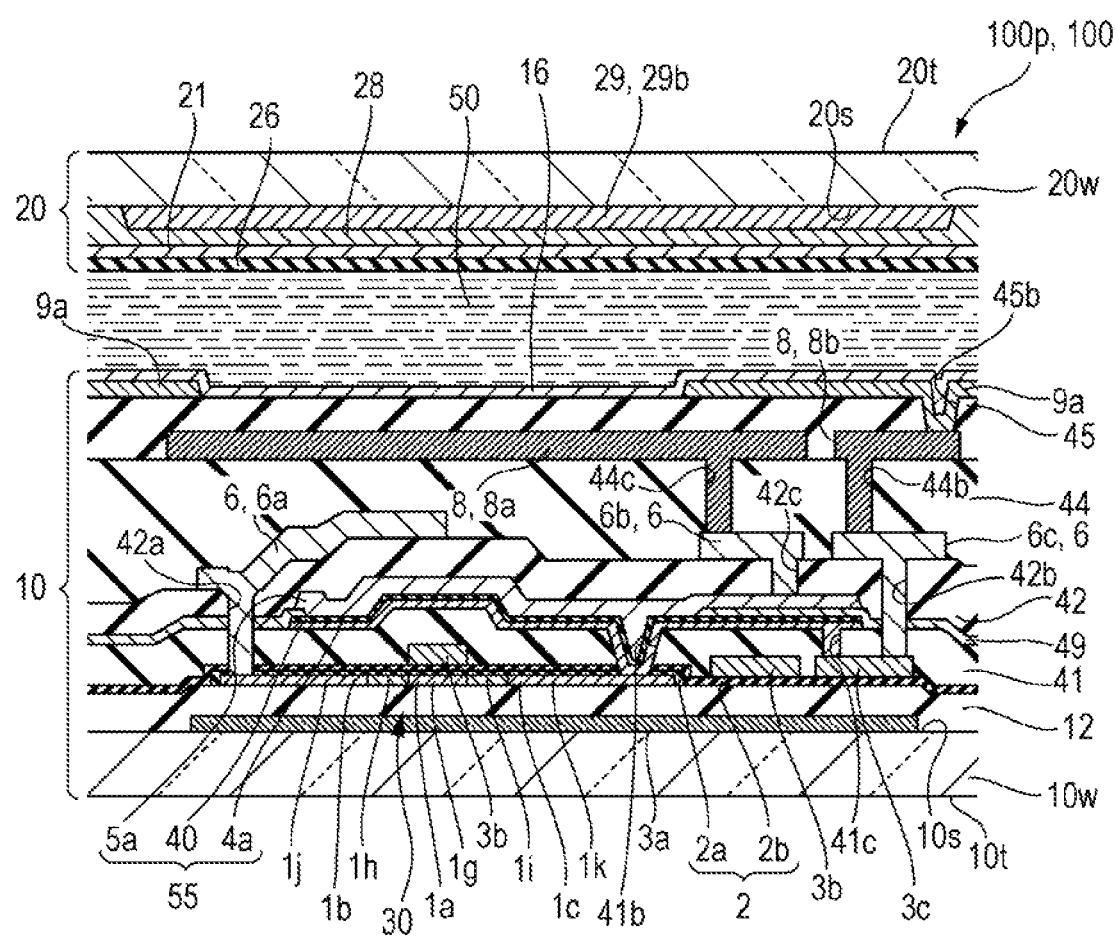
FIG. 4 is a sectional view taken along line IV-IV in the electro-optical device, which employs the invention, illustrated in FIG. 3.

FIG. 3 is a plan view of a plurality of pixels adjacent to each other in the element substrate 10 of the electro-optical device 100 which employs the invention. FIG. 4 is a sectional view taken along line IV-IV in the electro-optical device 100 according to a first embodiment of the invention, illustrated in FIG. 3. FIG. 5 is a plan view of a gate electrode 3b or the like which configures a pixel transistor 30 in the element substrate 10 of the electro optical device 100 according to the first embodiment of the invention. FIG. 6 is a plan view of a retention capacitor electrode which configures a retention capacitor 55 in the element substrate 10 of the electro-optical device 100 according to the first embodiment of the invention. FIG. 7 is a plan view of a data line 6a, a constant potential line 8a, or the like which is formed on the element substrate 10 of the electro-optical device 100 according to the first embodiment of the invention. In FIG. 3, FIG. 5, FIG. 6, and FIG. 7, each layer is denoted by the following lines.

scan line 3a=thin solid line
semiconductor layer 1a=thin and short dotted line
gate electrode 3b=thick solid line
first capacitor electrode 4a (first capacitor electrode layer)= thin and long dashed line
second capacitor electrode 5a (second capacitor electrode layer)=thin two-dotted chain line
data line 6a, relay electrode 6b, and relay electrode 6c=thick two-dotted chain line
constant potential line 8a and relay electrode 8b=thin one-dotted chain line
pixel electrode 9a=thick and long dashed line In addition, in FIG. 3, FIG. 5, FIG. 6, and FIG. 7, positions of ends are shifted so as to easily understand the shapes of the layers, with regard to the layers in which the ends overlap each other in a planar view. In addition, FIG. 5 illustrates the scan line 3a, the semiconductor layer 1a, the gate electrode 3b, and the like, FIG. 6 illustrates the first capacitor electrode 4a, the second capacitor electrode 5a, and the like, and FIG. 7 illustrates the data line 6a, the relay electrode 6b, the relay electrode 6c, the constant potential line 8a, and the relay electrode 8b. FIG. 7 also illustrates the semiconductor layer 1a.

In the following description, a Y direction corresponds to a "first direction" of the invention, and an X direction corresponds to a "second direction" of the invention. In addition, the data line 6a corresponds to a "first wire" of the invention, and the constant potential line 8a corresponds to a "second wire" of the invention. In addition, the relay electrode 6b corresponds to a "first relay electrode" of the invention, and the relay electrode 6c corresponds to a "second relay electrode" of the invention.

As illustrated in FIG. 3, FIG. 5, and FIG. 7, the pixel electrodes 9a are formed in each of the plurality of pixels 100a on the one surface 10s of the element substrate 10 which faces the counter substrate 20, and the data line 6a and the scan line 3a are formed along inter-pixel areas which are narrowed by the pixel electrodes 9a adjacent to each other. In the present embodiment, the inter-pixel areas extend in the vertical direction and horizontal direction, the scan line 3a linearly extends along a first inter-pixel area, which extends in the X direction (second direction), among the inter-pixel areas, and the data line 6a linearly extends along a second inter-pixel area which extends in the Y direction (first direction). That is, the scan line 3a extends along a boundary between one pixel 100a and another pixel 100a adjacent to the one pixel 100a in the Y direction. In addition, the data line 6a extends along a boundary between one pixel 100a and another pixel 100a adjacent to the one pixel 100a in the X direction. In addition, the pixel transistor 30 is formed in correspondence with an intersection between the data line 6a and the scan line 3a, and in the present embodiment, the pixel transistor 30 is formed by using the intersection area between the data line 6a and the scan line 3a and a peripheral area thereof. Here, while the data line 6a linearly extends in the Y direction with a constant width dimension, the scan line 3a includes a convex section 3e which extends in an extending direction of the data line 6a from the intersection between the scan line 3a and the data line 6a. The convex section 3e protrudes in the same length as that of one side Y1 and the other side Y2 in the Y direction from a main line section 3d of the scan line 3a in the X direction.

The element substrate 10 includes the constant potential line 8a which extends in at least one direction of the X direction and the Y direction. In the present embodiment, the constant potential line 8a extends in the Y direction so as to overlap the data line 6a in a planar view. The common potential Vcom is applied to the constant potential line 8a.

In FIG. 3, FIG. 4, FIG. 5, FIG. 6, and FIG. 7, in the element substrate 10, the pixel transistor 30, the pixel electrode 9a formed on a side opposite to a substrate body 10w with respect to the pixel transistor 30, the alignment film 16 formed on a side opposite to the pixel transistor 30 with respect to the pixel electrode 9a, and the like are formed on a substrate surface (one surface 10s side facing the counter substrate 20) on the liquid crystal layer 50 of the transparent substrate body 10w (substrate) such as, a quartz substrate or a glass substrate. In the counter substrate 20, the light shielding layer 29, the common electrode 21, the alignment film 26, and the like are formed on a surface (surface on the element substrate 10 side) of the substrate on the liquid crystal layer 50 side of the transparent substrate body 20w such as a quartz substrate or a glass substrate.

In the element substrate 10, the scan line 3a formed of a conductive polysilicon film, a metal silicide film, a conductive film such as a metal film or a metal compound film, and the like is formed on the one surface 10s side (between the substrate body 10w and the liquid crystal layer 50) of the substrate body 10w. In the present embodiment, the scan line 3a is formed of tungsten silicide (WSi), and functions as a light shielding film. That is, when light passes through the electro-optical device 100 and is reflected by other members, the scan line 3a can prevent the pixel transistors 30 from malfunctioning due to a light current which is generated by the reflected light that is incident on the semiconductor layer 1a.

On the one surface 10s side of the substrate body 10w, a transparent interlayer insulating film 12 such as a silicon oxide film is formed on an upper layer side (between the scan line 3a and the pixel electrode 9a) of the scan line 3a, and the pixel transistors 30 including the semiconductor layer 1a is formed on a surface side (between the interlayer insulating film 12 and the pixel electrode 9a) of the interlayer insulating film 12. The pixel transistors 30 includes the semiconductor layer 1a extending in the Y direction, and the gate electrode 3b which extends in the X direction intersecting a long side direction of the semiconductor layer 1a and overlaps the central portion of the long side direction of the semiconductor layer 1a. In the present embodiment, the gate electrode 3b and the scan line 3a are electrically connected to each other through a contact hole 12a (refer to FIG. 3) passing through the interlayer insulating film 12. In the present embodiment, the gate electrode 3b includes a main body section 3r which overlaps the semiconductor layer 1a in a planar view, and an extending section 3s which protrudes toward one side Y1 of the Y direction along the semiconductor layer 1a from an end of the main body section 3r on one side X1 of the X direction and extends along the scan line 3a. In addition, the gate electrode 3b includes a convex section 3t which protrudes toward the one side Y1 of the Y direction along the semiconductor layer 1a from an end of the main body section 3r on the other side X2 of the X direction.

The pixel transistors 30 includes a transparent gate insulating layer 2 between the semiconductor layer 1a and the gate electrode 3b. The semiconductor layer 1a includes a channel area 1g facing the gate electrode 3b through the gate insulating layer 2. In addition, the semiconductor layer 1a includes a drain area 1c is on one side (one side of the Y direction) of the channel area 1g, and includes a source area 1b on the other side (the other side of the Y direction) of the channel area 1g. In the present embodiment, the pixel transistors 30 includes an LDD structure. Thus, the source area 1b and the drain area 1c are respectively adjacent to the channel area 1g, respectively include low concentration areas 1h and 1i, and respectively include high concentration areas 1j and 1k in an area adjacent to a side opposite to the channel area 1g with respect to the low concentration areas 1h and 1i. In addition, the pixel electrode 9a is electrically connected to an end (high concentration area 1k of the drain area 1c) of the semiconductor layer 1a on the one side of the Y direction, and the data line 6a is electrically connected to an end (high concentration area 1j of the source area 1b) of the semiconductor layer 1a on the other side of the Y direction.

The semiconductor layer 1a is configured by a polysilicon film (polycrystalline silicon film). The gate insulating layer 2 is configured by a two-layer structure of a first gate insulating layer 2a which is configured by a silicon oxide film that is obtained by thermally oxidizing the semiconductor layer 1a, and a second gate insulating layer 2b which configured by silicon oxide film that is formed through a low pressure CVD method. The gate electrode 3b is configured by a conductive polysilicon film, a metal silicide film, or a conductive film such as a metal film or a metal compound film. In the present embodiment, the gate electrode 3b is configured by a conductive polysilicon film. In addition, the relay electrode 3c, which is separated from the gate electrode 3b on the one side X1 of the X direction, is formed on the same layer as the gate electrode 3b, and the relay electrode 3c is configured by a conductive film which is formed at the same time as the gate electrode 3b. The relay electrode 3c is formed on an area which overlaps the scan line 3a.

A transparent interlayer insulating film 41 formed of a silicon oxide film such NSG, PSG, BSG, or BPSG is formed on an upper layer side (between the gate electrode 3b and the pixel electrode 9a) of the gate electrode 3b, and a first capacitor electrode 4a (first capacitor electrode layer) is formed on an upper layer of the interlayer insulating film 41. In the present embodiment, the first capacitor electrode 4a is configured by a conductive polysilicon film, a metal silicide film, or a conductive film such as a metal film or a metal compound film. In the present embodiment, the first capacitor electrode 4a is configured by a conductive polysilicon film. The first capacitor electrode 4a is formed such that a portion thereof overlaps the drain area 1c (source-drain area on the pixel electrode side) of the semiconductor layer 1a, and is electrically connected to the drain area 1c through the contact hole 41b which passes through the interlayer insulating film 41 and the gate insulating layer 2.

A transparent dielectric layer 40, and a transparent etching stopper layer 49 configured by a silicon oxide film or the like are formed on an upper layer side (between the first capacitor electrode 4a and the liquid crystal layer 50) of the first capacitor electrode 4a, and the second capacitor electrode 5a (second capacitor electrode layer) is formed on an upper layer side of the dielectric layer 40. In addition to a silicon compound such as a silicon oxide film or a silicon nitride film, a high-k dielectric layer such as, an aluminum oxide film, a titanium oxide film, an tantalum oxide film, a niobium oxide film, a hafnium oxide film, a lanthanum oxide film, or a zirconium oxide film can be used for the transparent dielectric layer 40. The second capacitor electrode 5a is configured by a conductive polysilicon film, a metal silicide film, or a conductive film such as a metal film or metal compound film. In the present embodiment, the second capacitor electrode 5a is configured by a tungsten silicide film. Here, the second capacitor electrode 5a is formed more widely than the first capacitor electrode 4a, and the retention capacitor 55 is formed in an area in which the second capacitor electrode 5a and the first capacitor electrode 4a overlaps to each other through the dielectric layer 40.

In the present embodiment, each of the first capacitor electrode 4a and the second capacitor electrode 5a extends so as to overlap to each other along the scan line 3a and the data line 6a from an intersection between the scan line 3a and the data line 6a. Specifically, the first capacitor electrode 4a and the second capacitor electrode 5a extend in the X direction so as to overlap the scan line 3a from the intersection between the scan line 3a and the data line 6a, and lengths of portions 4e and 5e extending toward one side X1 of the X direction from the intersection between the scan line 3a and the data line 6a are longer than lengths of portions 4f and 5f extending toward the other side X2 of the X direction. In addition, the first capacitor electrode 4a and the second capacitor electrode 5a extend in the Y direction so as to overlap the data line 6a from the intersection between the scan line 3a and the data line 6a, and lengths of portions 4g and 5g extending toward one side Y1 of the Y direction from the intersection between the scan line 3a and the data line 6a are longer than lengths of portions 4h and 5h extending toward the other side Y2 of the Y direction.

An interlayer insulating film 42 is formed on an upper layer side (between the second capacitor electrode 5a and the pixel electrode 9a) of the second capacitor electrode 5a, and a first metal layer 6 with light shielding properties which includes the data line 6a, the relay electrode 6b, and the relay electrode 6c is formed on an upper layer side (between the interlayer insulating film 42 and the pixel electrode 9a) of the interlayer insulating film 42. That is, the data line 6a, the relay electrode 6b, and the relay electrode 6c are configured by the first metal layer 6 which is simultaneously formed, and are formed on the same layer. The interlayer insulating film 42 is configured by a silicon oxide film. The first metal layer 6 includes an aluminum layer. In the present embodiment, the first metal layer 6 is configured by a laminated film of a titanium nitride layer, an aluminum layer, and a titanium nitride layer.

The data line 6a extends in the Y direction and overlaps the semiconductor layer 1a in a planar view, and is electrically coupled to the other side end (high concentration area 1j of source area 1b) of the semiconductor layer 1a through a contact hole 42a which passes through the interlayer insulating film 42, the etching stopper layer 49, an interlayer insulating film 41, and a gate insulating layer 2.

The relay electrode 6b is electrically coupled to the second capacitor electrode 5a through a contact hole 42c which passes through the interlayer insulating film 42. The relay electrode 6c is electrically coupled to a relay electrode 3c through a contact hole 42b which passes through the interlayer insulating film 42, the etching stopper layer 49, and the interlayer insulating film 41. In the present embodiment, the relay electrode 6b is separated from the data line 6a in the X direction, in an area in which the relay electrode 6b overlaps the scan lines 3a in a planar view. The relay electrode 6c is separated from the data line 6a in the X direction, in an area in which the relay electrode 6c overlaps the scan lines 3a in a planar view. In addition, the relay electrode 6b is separated from the relay electrode 6c in the X direction.

A transparent interlayer insulating film 44 configured by a silicon oxide film or the like is formed on upper layer sides (between the data line 6a and the pixel electrode 9a) of the data line 6a, the relay electrode 6b, and the relay electrode 6c. The interlayer insulating film 44 is configured by a silicon oxide film, and a surface thereof is planarized.

A second metal layer 8 with light shielding properties which includes the constant potential line 8a and the relay electrode 8b is formed on an upper layer side (between the interlayer insulating film 44 and the pixel electrode 9a) of the interlayer insulating film 44. That is, the constant potential line 8a and the relay electrode 8b are configured by the second metal layer 8 which is simultaneously formed, and are formed on the same layer. The second metal layer 8 includes an aluminum layer. In the present embodiment, the second metal layer 8 is configured by a laminated film in which a titanium nitride layer is laminated on an aluminum layer. The constant potential line 8a extends in the Y direction and a portion of the constant potential line 8a overlaps the data line 6a in a planar view. In addition, a portion of the constant potential line 8a also overlaps the relay electrode 6b in a planar view, and the constant potential line 8a is electrically coupled to the relay electrode 6b through a contact hole 44c which passes through the interlayer insulating film 44. A portion of the relay electrode 8b overlaps the relay electrode 6c in a planar view, and the relay electrode 8b is electrically coupled to the relay electrode 6c through a contact hole 44b which passes through the interlayer insulating film 44.

A transparent interlayer insulating film 45 configured by a silicon oxide film or the like is formed on upper layer sides (between the constant potential line 8a and the pixel electrode 9a) of the constant potential line 8a and the relay electrode 8b. The pixel electrode 9a configured by an ITO film or the like is formed on an upper layer side of the interlayer insulating film 45. A portion of the pixel electrode 9a overlaps the relay electrode 8b in a planar view. A contact hole 45b which reaches the relay electrode 8b is formed in the interlayer insulating film 45. The pixel electrode 9a is electrically coupled to the relay electrode 8b through the contact hole 45b. As a result, the pixel electrode 9a is electrically coupled to a drain area 1c through the relay electrode 8b, the relay electrode 6c, a relay electrode 3c, and the first capacitor electrode 4a. The interlayer insulating film 45 is configured by a first insulating film on a lower layer side configured by, for example, NSG (non-silicate glass), and a second insulating film on an upper layer side configured by BSG (boron silicate glass). A surface of the interlayer insulating film 45 is planarized.

The alignment film 16 which is configured by polyimide or inorganic counter film is formed on a surface side of the pixel electrode 9a. In the embodiment, the alignment film 16 is configured by an oblique deposition film (tilt vertical alignment film or inorganic alignment film) such as, $SiO_x$ (x<2), $SiO_2$, $TiO_2$, MgO, $Al_2O_3$, $In_2O_3$, $Sb_2O_3$, or $Ta_2O_5$.

Configuration of Counter Substrate 20

In the counter substrate 20, the light shielding layer 29, an insulating film 28 configured by a silicon oxide film or the like, and the common electrode 21 configured by a transparent conductive film such as an ITO film are formed on a surface (the one surface 20s facing the element substrate 10) on the liquid crystal layer 50 of the transparent substrate body 20w (transparent substrate) such as a quartz substrate, a glass substrate or the like. The alignment film 26 configured by polysilicon or an inorganic alignment film is formed so as to cover the common electrode 21. In the present embodiment, the common electrode 21 is configured by an ITO film. In the present embodiment, the alignment film 26 is an oblique deposition film (tilt vertical alignment film or inorganic alignment film) such as, $SiO_x$ (x<2), $SiO_2$, $TiO_2$, MgO, $Al_2O_3$, $In_2O_3$, $Sb_2O_3$, or $Ta_2O_5$ in the same manner as the alignment film 16. The alignment films 16 and 26 align obliquely and vertically nematic liquid crystal compounds with negative dielectric anisotropy which are used for the liquid crystal layer 50, and the liquid crystal panel 100p operates in a VA mode of normal black. In the present embodiment, an oblique deposition film of a silicon oxide film ($SiO_x$) among various inorganic alignment films is used for the alignment films 16 and 26.

Light Shielding Structure with Respect to Semiconductor Layer 1a

Figure 8A:
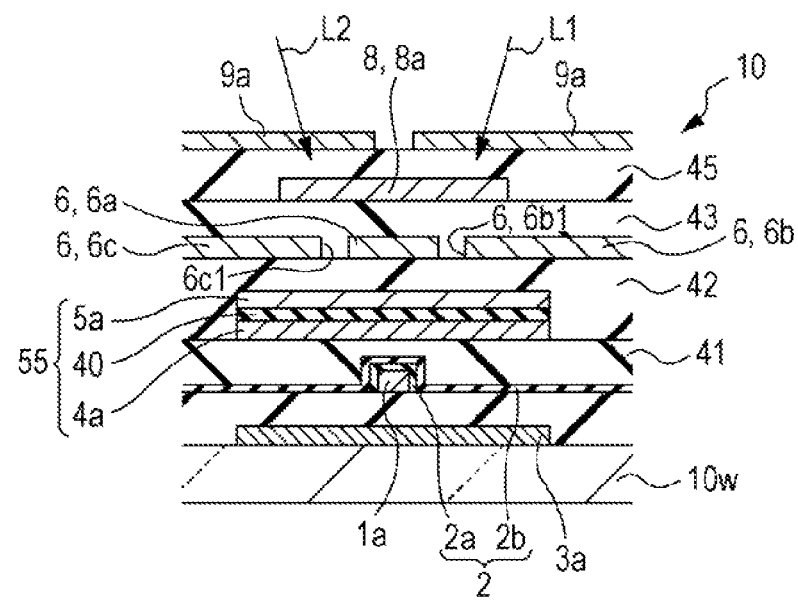
FIGS. 8A and 8B are explanatory views illustrating a light shielding structure with respect to a semiconductor layer in the electro-optical device that employs the invention.
Figure 8B:
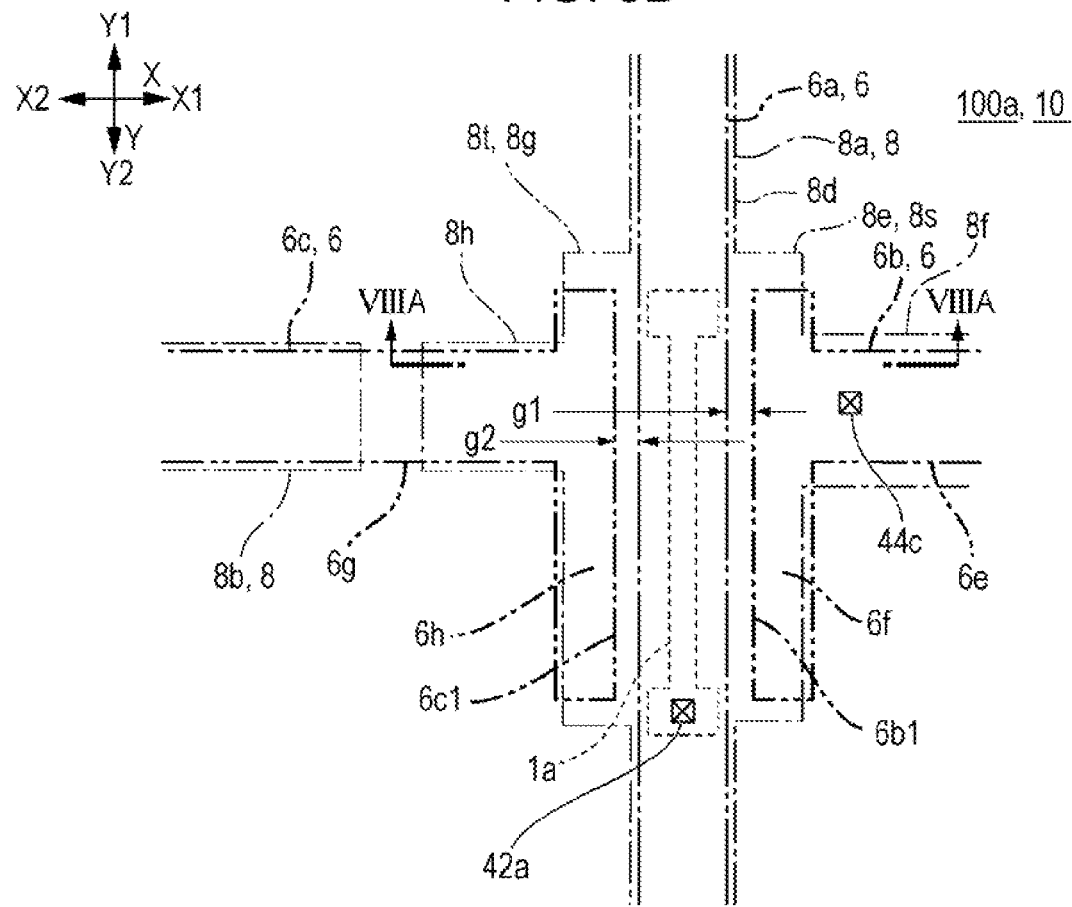

FIGS. 8A and 8B are explanatory views illustrating a light shielding structure with respect to the semiconductor layer 1a in the electro-optical device 100 that employs the invention, FIG. 8A is a sectional view schematically illustrating a cross section when the data line 6a or the like is cut along line VIIIA-VIIIA which extends in the X direction through the semiconductor layer 1a, and FIG. 8B is an enlarged plan view illustrating a positional relationship between the semiconductor layer 1a, the data line 6a and the like.

As described with reference to FIGS. 3 and 4, or the like, the element substrate 10 of the electro-optical device 100 includes the substrate body 10w, the pixel transistor 30 including the semiconductor layer 1a extending in the Y direction (first direction) on the one surface 10s side of the substrate body 10w, and the pixel electrode 9a provided on a side opposite to the substrate body 10w with respect to the semiconductor layer 1a. The pixel electrode 9a is electrically coupled to one side end (high concentration area 1k of the drain area 1c) of the semiconductor layer 1a.

In addition, the transparent first metal layer 6 is formed between the layer of the pixel transistors 30 and the layer of the pixel electrode 9a, in the element substrate 10. The first metal layer 6 includes the data line 6a (first wire) which extends in the Y direction and overlaps the semiconductor layer 1a in a planar view, the relay electrode 6b (first relay electrode) which is separated from the data line 6a on the one side X1 of the X direction, and the relay electrode 6c (second relay electrode) which is separated from the data line 6a on the other side X2 of the X direction. A width dimension (dimension in the X direction) of the data line 6a is larger than a width dimension (dimension in the X direction) of the semiconductor layer 1a, and the data line 6a fully covers an upper layer side of the semiconductor layer 1a.

Furthermore, the second metal layer 8 with light fielding properties is formed between the first metal layer 6 and the layer of the pixel electrode 9a, in the element substrate 10. The second metal layer 8 includes the constant potential line 8a (second wire) which extends in the Y direction and overlaps the data line 6a in a planar view, and the relay electrode 8b which overlaps the relay electrode 6c in a planar view on the one side X1 of the X direction. The constant potential line 8a includes a main line section 8d extending in the Y direction. A width dimension (dimension in the X direction) of the main line section 8d is larger than a width dimension (dimension in the X direction) of the data line 6a, and the constant potential line 8a fully covers an upper layer side of the data line 6a.

In the element substrate 10 having the aforementioned configuration, as illustrated in FIGS. 8A and 8B, an end 6b1 of the other side X2 of the X direction is separated from the data line 6a by a first gap g1, and the relay electrode 6b extends in the Y direction along the semiconductor layer 1a. In the present embodiment, the relay electrode 6b includes a first main body section 6e which extends in the X direction, and a first protrusion section 6f which protrudes toward one side Y1 and the other side Y2 of the Y direction from an end of the other side X2 of the X direction of the first main body section 6e. An end of the other side X2 of the X direction of the first protrusion section 6f is set as an end 6b1 of the other side X2 of the X direction of the relay electrode 6b, and faces the data line 6a in a state of being separated by the first gap g1. Here, the end 6b1 of the relay electrode 6b extends along the entirety of the source area 1b, the channel area 1g, and the drain area 1c of the semiconductor layer 1a.

In the relay electrode 6c, an end 6c1 of the one side X1 of the X direction is separated from the data line 6a by a second gap g2 and extends in the Y direction along the semiconductor layer 1a. In the present embodiment, the relay electrode 6c includes a second main body section 6g which extends in the X direction, and a second protrusion section 6h which protrudes toward the one side Y1 and the other side Y2 of the Y direction from an end of the one side X1 of the X direction of the second main body section 6g. An end of the one side X1 of the X direction of the second protrusion section 6h is set as an end 6c1 on the data line 6a side, and faces the data line 6a in a state of being separated by the second gap g2. Here, the end 6c1 of the relay electrode 6c extends along the entirety of the source area 1b, the channel area 1g, and the drain area 1c of the semiconductor layer 1a.

In the element substrate 10, the second metal layer 8 includes a first light shielding section 8s which overlaps the first gap g1 in a planar view. More specifically, the constant potential line 8a on the second metal layer 8 includes a main line section 8d which extends in the Y direction and overlaps the data line 6a in a planar view, and a first projection section 8e which projects toward the one side X1 of the X direction from a position which overlaps an intersection between the data line 6a of the main line section 8d and the scan line 3a. The first projection section 8e is set as the first light shielding section 8s of the second metal layer 8, and overlaps the first gap g1 in a planar view. In the present embodiment, the first projection section 8e further projects toward the one side X1 of the X direction from an area which overlaps the first gap g1 in a planar view, and overlaps the first protrusion section 6f of the relay electrode 6b in a planar view.

Furthermore, the second metal layer 8 includes a second light shielding section 8t which overlaps the second gap g2 in a planar view. More specifically, the constant potential line 8a on the second metal layer 8 includes a second projection section 8g which projects toward the other side X2 of the X direction from a position which overlaps an intersection between the data line 6a of the main line section 8d and the scan line 3a. The second projection section 8g is set as the second light shielding section 8t of the second metal layer 8, and overlaps the second gap g2 in a planar view. In the present embodiment, projection dimensions of the first projection section 8e and the second projection section 8g are the same as each other, and the second projection section 8g further projects toward the other side X2 of the X direction from an area which overlaps the second gap g2 in a planar view, and overlaps the second protrusion section 6h of the relay electrode 6c in a planar view.

In the present embodiment, the constant potential line 8a includes a convex section 8f which further protrudes toward the one side X1 of the X direction from the first projection section 8e. The convex section 8f overlaps the relay electrode 6b in a planar view, and is electrically coupled to the relay electrode 6b through the contact hole 44c. However, the convex section 8f is separated from the relay electrode 8b in the X direction. In addition, the constant potential line 8a includes a convex section 8h which further protrudes toward the other side X2 of the X direction from the second projection section 8g, and the convex section 8h is separated from the relay electrode 8b in the X direction. In the present embodiment, a protrusion dimension of the convex section 8f is smaller than that of the convex section 8h.

Main Effects of the Present Embodiment

As described above, in the electro-optical device 100 according to the present embodiment, the data line 6a (first wire) on the first metal layer 6 fully covers the upper layer side (incident side of illumination light) of the semiconductor layer 1a. In addition, the main line section 8d of the constant potential line 8a (second wire) on the second metal layer 8 fully covers the upper layer side (incident side of illumination light) of the data line 6a. For this reason, illumination light hardly reaches the semiconductor layer 1a, and thus, it is possible to prevent flicker or the like from occurring due to light leakage current.

In addition, in the relay electrode 6b (first relay electrode) on the first metal layer 6, the end the 6b1 on the first wire 6a side extends along the semiconductor layer 1a in the Y direction (first direction) and faces the data line 6a through the first gap g1. In addition, the first metal layer 6 is closer to the semiconductor layer 1a than the second metal layer 8. For this reason, it is possible to prevent illumination light L1 which travels from a tilted direction toward a side (one side X1 of the X direction) at which the relay electrode 6b is located from reaching the semiconductor layer 1a. Here, since different potentials are applied to the data line 6a and the relay electrode 6b, it is necessary to form a width of the first gap g1 at a quite sufficient size, but even in this case, the first light shielding section 8s of the second metal layer 8 overlaps the first gap g1 in a planar view. For this reason, it is possible to reliably prevent the illumination light L1 which travels toward the semiconductor layer 1a from a tilted direction toward a side (one side X1 of the X direction) at which the relay electrode 6b is located from reaching the semiconductor layer 1a.

In addition, the relay electrode 6b includes the first main body section 6e which extends in the X direction (second direction), and the first protrusion section 6f which protrudes in the Y direction from an end of the data line 6a side of the first main body section 6e and faces the semiconductor layer 1a through the first gap g1 in a planar view. For this reason, since the first protrusion section 6f extends along the semiconductor layer 1a, it is possible to form a wider pixel opening, compared to a case in which the entire relay electrode 6b extends in the Y direction.

In addition, the first metal layer 6 includes the relay electrode 6c (second relay electrode) separated from the data line 6a on the other side X2 of the X direction. In the relay electrode 6c, the end 6c1 of the data line 6a extends along the semiconductor layer 1a in the Y direction (first direction) and faces the data line 6a through the second gap g2. For this reason, it is possible to prevent illumination light L2 which travels from a tilted direction toward a side (the other side X2 of the X direction) at which the relay electrode 6c is located from reaching the semiconductor layer 1a. Here, since different potentials are applied to the data line 6a and the relay electrode 6c, it is necessary to form a width of the second gap g2 at a quite sufficient size, but even in this case, the second light shielding section 8t of the second metal layer 8 overlaps the second gap g2 in a planar view. For this reason, it is possible to reliably prevent the illumination light L2 which travels toward the semiconductor layer 1a from a tilted direction toward a side (the other side X2 of the X direction) at which the relay electrode 6c is located from reaching the semiconductor layer 1a.

In addition, the relay electrode 6c includes the second main body section 6g which extends in the X direction (second direction), and the second protrusion section 6h which protrudes in the Y direction from an end of the data line 6a side of the second main body section 6g and faces the semiconductor layer 1a through the second gap g2 in a planar view. For this reason, since the second protrusion section 6h extends along the semiconductor layer 1a, it is possible to form a wider pixel opening, compared to a case in which the entire relay electrode 6c extends in the Y direction.

In addition, the constant potential line 8a extends in the Y direction and overlaps the data line 6a in a planar view. The first light shielding section 8s includes the first projection section 8e which projects toward the one side X1 of the X direction from the constant potential line 8a. In addition, the second light shielding section 8t includes the second projection section 8g which projects toward the other side X2 of the X direction from the constant potential line 8a. Thus, it is possible to realize a configuration in which the second metal layer 8 overlaps the first gap g1 and the second gap g2 in a planar view, using a simple configuration.

In addition, both the first metal layer 6 and the second metal layer 8 include an aluminum layer, and the aluminum layer has a small resistance and can have a substantially infinite OD value. Therefore, according to the first metal layer 6 and the second metal layer 8, it is possible to reduce a wiring resistance of the data line 6a and the constant potential line 8a, and to increase light shielding properties with respect to the semiconductor layer 1a.

In addition, in the present embodiment, electrodes (the first capacitor electrode 4a and the second capacitor electrode 5a) configuring the retention capacitor 55 are provided between the semiconductor layer 1a and the first metal layer 6, and the first capacitor electrode 4a and the second capacitor electrode 5a also function as a light shielding film with respect to the semiconductor layer 1a. That is, the first capacitor electrode 4a is configured by a conductive polysilicon film. Since the second capacitor electrode 5a is configured by a tungsten silicide film, an OD value with respect to illumination light is lower than that of the first metal layer 6 and the second metal layer 8. Nevertheless, if the illumination light is leaked through the first gap g1 and the second gap g2, it is possible to shield the leaked light using the first capacitor electrode 4a and the second capacitor electrode 5a.

In addition, in the present embodiment, the gate electrode 3b is provided between the semiconductor layer 1a and the first metal layer 6, and the gate electrode 3b includes the extending section 3s and the convex section 3t which protrude toward the one side Y1 of the Y direction along the semiconductor layer 1a from the main body section 3r which overlaps the semiconductor layer 1a in a planar view. For this reason, the extending section 3s and the convex section 3t of the gate electrode 3b also functions as a light shielding film with respect to the semiconductor layer 1a. That is, since the gate electrode 3b is configured by a conductive polysilicon film, an OD value with respect to the illumination light is lower than those of the first metal layer 6 and the second metal layer 8. Nevertheless, if the illumination light is leaked through the first gap g1 and the second gap g2, it is possible to shield the leaked light using the gate electrode 3b.

Another Embodiment

Figure 9A:
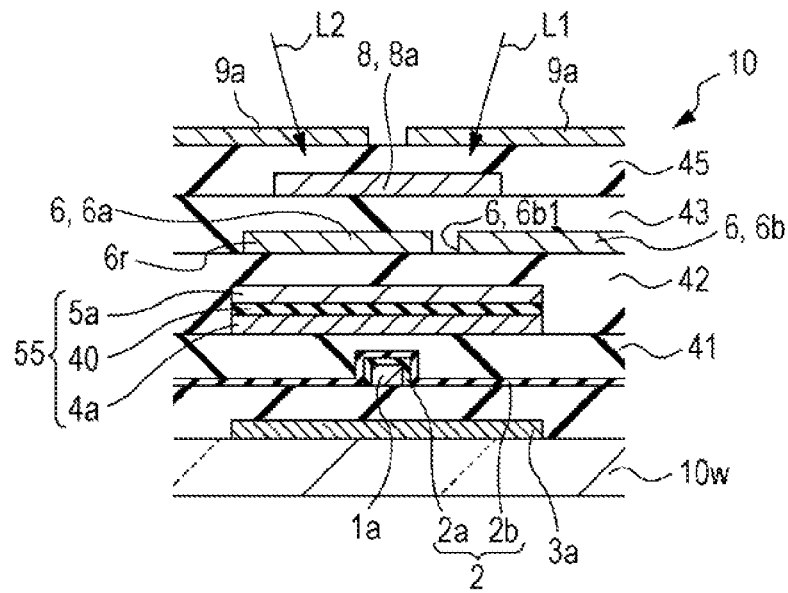
FIGS. 9A and 9B are explanatory views illustrating a light shielding structure with respect to a semiconductor layer in another electro-optical device that employs the invention.
Figure 9B:
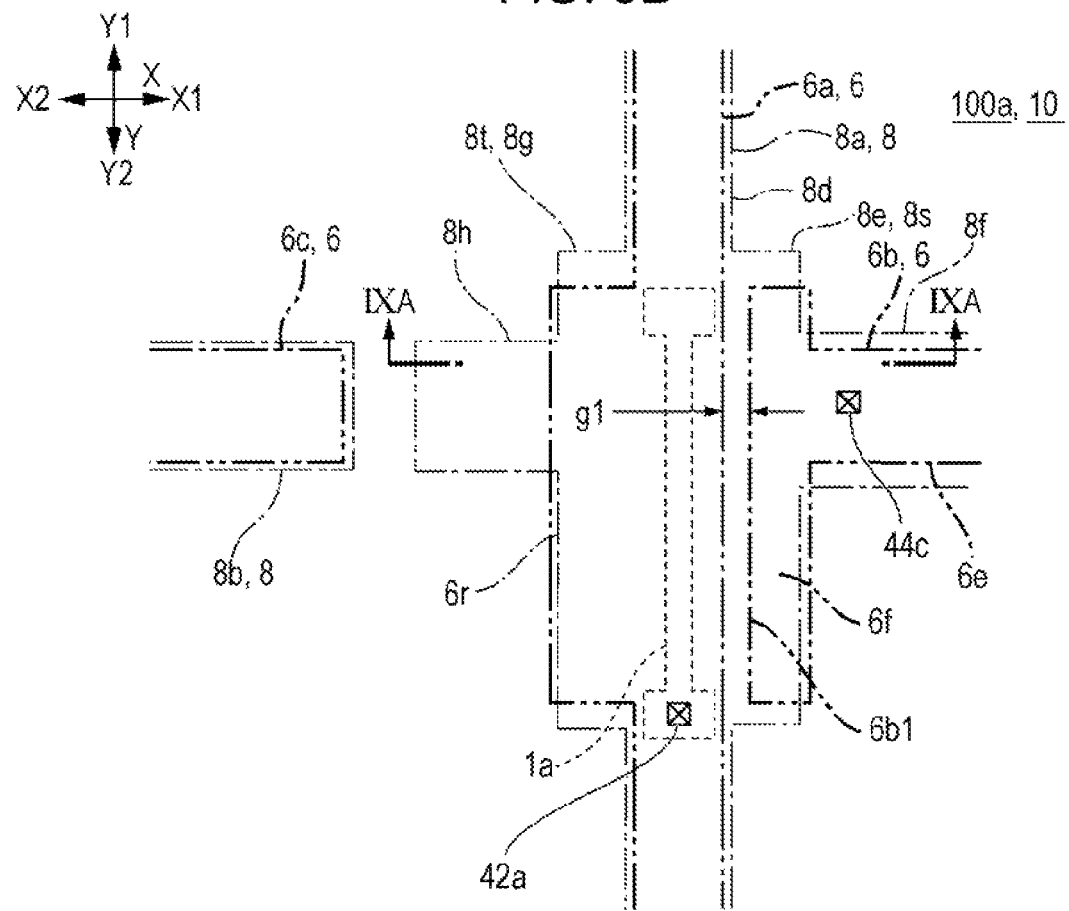

FIGS. 9A and 9B are explanatory views illustrating a light shielding structure with respect to the semiconductor layer 1a in another electro-optical device 100 that employs the invention, FIG. 9A is a sectional view schematically illustrating a cross section when the data line 6a or the like is cut along line IXA-IXA which extends in the X direction through the semiconductor layer 1a, and FIG. 9B is an enlarged plan view illustrating a positional relationship between the semiconductor layer 1a, the data line 6a and the like. Since a basic configuration of the present embodiment is the same as the aforementioned embodiment, the same symbols or reference numerals will be attached to the same configuration elements, and description thereof will be omitted.

As illustrated in FIGS. 9A and 9B, in the same manner as in the aforementioned embodiment, also in the present embodiment, the end 6b1 of the data line 6a extends along the semiconductor layer 1a in the Y direction (first direction) and faces the data line 6a through the first gap g1, in the relay electrode 6b (first relay electrode). In addition, the second metal layer 8 overlaps the first gap g1 in a planar view. For this reason, it is possible to reliably prevent light which travels toward the semiconductor layer 1a from a tilted direction toward a side at which the relay electrode 6b is located from reaching the semiconductor layer 1a.

In contrast to this, on the other side X2 of the X direction with respect to the data line 6a, the projection section 6r which projects toward the other side X2 of the X direction from the data line 6a extends in the Y direction along the semiconductor layer 1a. For this reason, even if the relay electrode 6c does not extend in the Y direction (first direction) along the semiconductor layer 1a, it is possible to reliably prevent light which travels from a tilted direction toward a side at which the relay electrode 6c is located from reaching the semiconductor layer 1a.

Yet Another Embodiment

In the aforementioned embodiment, the end 6b1 of the relay electrode 6b and the end 6c1 of the relay electrode 6c extend along all of the source area 1b, the channel area 1g, and the drain area 1c of the semiconductor layer 1a. For this reason, even in a case in which polarity of a potential which is applied to the liquid crystal layer 50 is inverted, it is possible to prevent light from being incident on a drain terminal of the semiconductor layer 1a.

However, if the polarity of the potential which is applied to the liquid crystal layer 50 is not inverted, a configuration in which the end 6b1 of the relay electrode 6b and the end 6c1 of the relay electrode 6c extend only along the drain side (one side on which the pixel electrode 9a is coupled) of the semiconductor layer 1a may be employed.

Mounting Example to Electronic Apparatus

Configuration Example of Projection Type Display Device and Optical Unit

Figure 10:
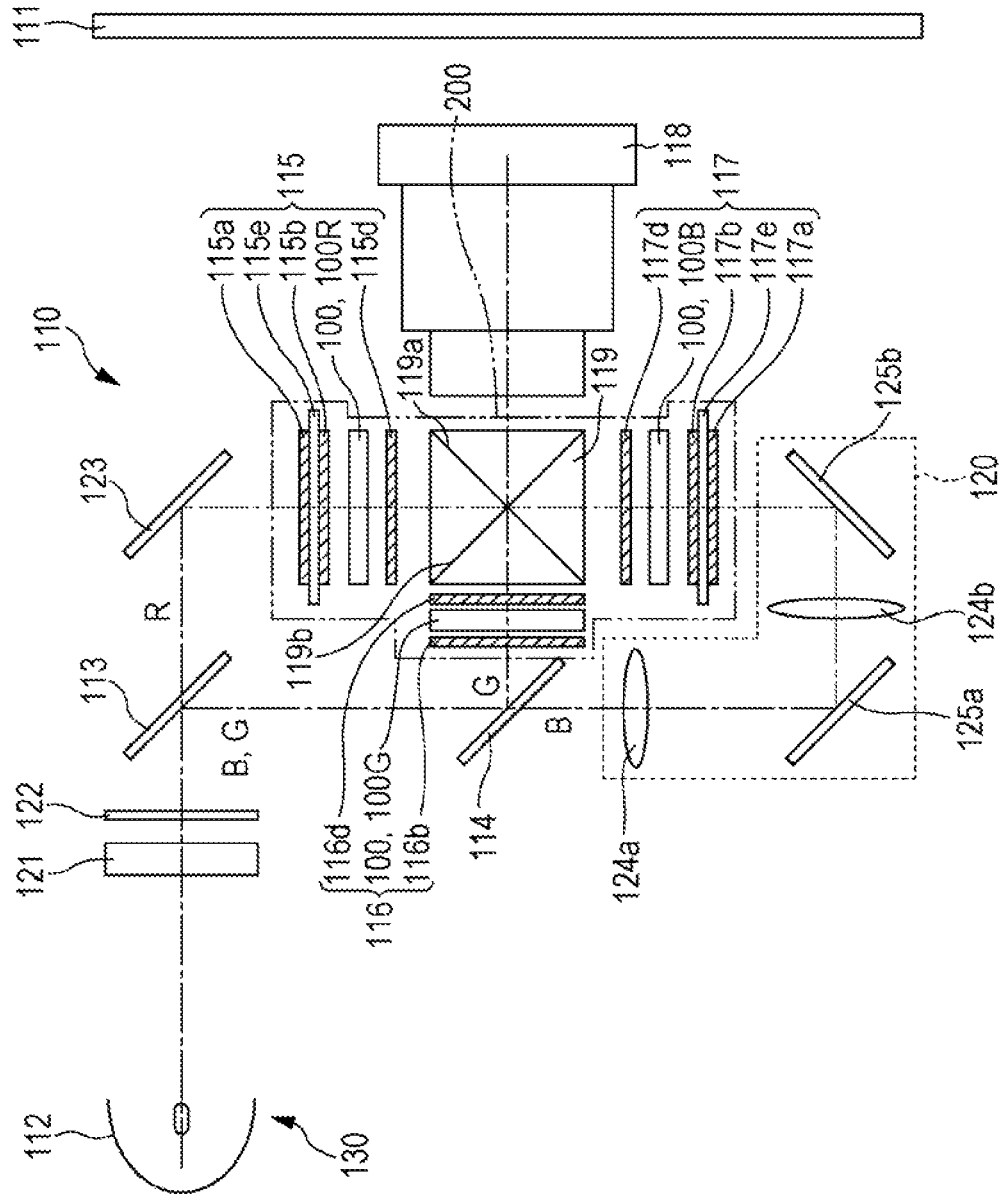
FIG. 10 is a schematic configuration view of a projection type display device (electronic apparatus) and an optical unit which employs the invention.

FIG. 10 is a schematic configuration view of a projection type display device (electronic apparatus) and an optical unit which employ the invention.

The projection type display device 110 illustrated in FIG. 10 is a so-called projection type display device which radiates a screen 111 provided on a viewer side with light, and views the light reflected by the screen 111. The projection type display device 110 includes the light source unit 130 including a light source 112, dichroic mirrors 113 and 114, liquid crystal light valves 115 to 117, a projection optical system 118, the cross dichroic prism 119 (synthesis optical system), and a relay system 120. The electro-optical device 100 and the cross dichroic prism 119 configure an optical unit 200.

The light source 112 is configured by an extra high pressure mercury lamp which supplies light including red light R, green light G, and blue light B. The dichroic mirror 113 makes the red light R from the light source 112 pass through, reflects the green light G and the blue light B. In addition, the dichroic mirror 114 makes the blue light B pass through and reflects the green light G, among the green light G and the blue light B which are reflected by the dichroic mirror 113. In this way, the dichroic mirrors 113 and 114 configures a color separation optical system which separates the light emitted from the light source 112 into the red light R, the green light G, and the blue light B.

Here, an integrator 121 and a polarization conversion element 122 are sequentially disposed from the light source 112, between the dichroic mirror 113 and the light source 112. The integrator 121 uniformizes illumination distribution of the light emitted from the light source 112. In addition, the polarization conversion element 122 polarizes the light from the light source 112, for example, polarizes so as to have a specific vibration direction like as s-polarized light.

The liquid crystal light valve 115 is a transmission type liquid crystal device that modulates the red light which passes through the dichroic mirror 113 and is reflected by the reflection mirror 123, according to an image signal. The liquid crystal light valve 115 includes a λ/2 phase difference plate 115a, a first polarizing plate 115b, the electro-optical device 100 (liquid crystal panel 100R for red color), and a second polarizing plate 115d. Here, even if the red light R incident on the liquid crystal light valve 115 passes through the dichroic mirror 113, polarization of the light is not changed, and thus includes s-polarized light as it is.

The λ/2 phase difference plate 115a is an optical element which converts s-polarized light incident on the liquid crystal light valve 115 into a p-polarized light. In addition, the first polarizing plate 115b is a polarizing plate which blocks the s-polarized light and makes the p-polarized light pass through. Thus, the electro-optical device 100 (liquid crystal panel 100R for red color) converts the p-polarized light into s-polarized light (if halftone, circularly polarized light or elliptically polarized light) by a modulation according to an image signal. Furthermore, the second polarizing plate 115d is a polarizing plate which blocks the p-polarized light and makes the s-polarized light pass through. Thus, the liquid crystal light valve 115 modulates the red light R according to an image signal and emits the modulated red light R toward the cross dichroic prism 119.

The λ/2 phase difference plate 115a and the first polarizing plate 115b are disposed in a state of being in contact with a light transmitting glass plate 115e which does not convert the polarized light, and the λ/2 phase difference plate 115a and the first polarizing plate 115b can avoid distortion due to heat.

The liquid crystal light valve 116 is a transmitting type liquid crystal device that modulates the green light G which is reflected by the dichroic mirror 113 and is reflected by the dichroic mirror 114, according to an image signal. The liquid crystal light valve 116 includes a first polarizing plate 116b, the electro-optical device 100 (liquid crystal panel 100G for green color), and a second polarizing plate 116d, in the same manner as the liquid crystal light valve 115. The green light G incident on the liquid crystal light valve 116 is the s-polarized light which is reflected by the dichroic mirrors 113 and 114 and incident. The first polarizing plate 116b is a polarizing plate which blocks the p-polarized light and makes the s-polarized light pass through. In addition, the electro-optical device 100 (liquid crystal panel 100G for green color) converts the s-polarized light into the p-polarized light (if halftone, circularly polarized light or elliptically polarized light) by a modulation according to an image signal. Then, the second polarizing plate 116d is a polarizing plate which blocks the s-polarized light and makes the p-polarized light pass through. Thus, the liquid crystal light valve 116 modulates the green light G according to an image signal and emits the modulated green light G toward the cross dichroic prism 119.

The liquid crystal light valve 117 is a transmitting type liquid crystal device that modulates the blue light B which is reflected by the dichroic mirror 113 and passes through the dichroic mirror 114 and passes through the relay system 120, according to an image signal. The liquid crystal light valve 117 includes a λ/2 phase difference plate 117a, a first polarizing plate 117b, the electro-optical device 100 (liquid crystal panel 100B for blue color), and a second polarizing plate 117d, in the same manner as the liquid crystal light valves 115 and 116. Here, the blue light B incident on the liquid crystal light valve 117 is reflected by the dichroic mirror 113, passes through the dichroic mirror 114 and is reflected by two reflection mirrors 125a and 125b, which will be described later, of the relay system 120, and thus becomes the s-polarized light.

The λ/2 phase difference plate 117a is an optical system which converts the s-polarized light incident on the liquid crystal light valve 117 into the p-polarized light. In addition, the first polarizing plate 117b is a polarizing plate which blocks the s-polarized light and makes the p-polarized light. Then, the electro-optical device 100 (liquid crystal panel 100B for blue color) converts the p-polarized light into the s-polarized light (circularly polarized light or elliptically polarized light, if halftone) by a modulation according to an image signal. Furthermore, the second polarizing plate 117d is a polarizing plate which blocks the p-polarized light and makes the s-polarized light pass through. Thus, the liquid crystal light valve 117 modulates the blue light B according to an image signal and emits the modulated blue light B toward the cross dichroic prism 119. The λ/2 phase difference plate 117a and the first polarizing plate 117b are disposed in a state of being in contact with the glass plate 117e.

The relay system 120 includes relay lenses 124a and 124b, and reflection mirrors 125a and 125b. The relay lenses 124a and 124b are provided so as to prevent a light loss due to a long optical path of the blue light B. Here, the relay lens 124a is disposed between the dichroic mirror 114 and the reflection mirror 125a. In addition, the relay lens 124b is disposed between the reflection mirrors 125a and 125b. The reflection mirror 125a is disposed so as to reflect the blue light B which passes through the dichroic mirror 114 and is emitted from the relay lens 124a toward the relay lens 124b. In addition, the reflection mirror 125b is disposed so as to reflect the blue light B which is emitted from the relay lens 124b toward the liquid crystal light valve 117.

The cross dichroic prism 119 is a photosynthesis optical system in which two dichroic films 119a and 119b are orthogonally disposed in an X shape. The dichroic film 119a is a film which reflects the blue light B and makes the green light G pass through, and the dichroic film 119b is a film which reflects the red light R and makes the green light G pass through. Thus, the cross dichroic prism 119 synthesizes the red light R, the green light G, and the blue light B which are modulated by each of the liquid crystal light valves 115 to 117, and emits the synthesized light toward the projection optical system 118.

The light incident on the cross dichroic prism 119 from the liquid crystal light valves 115 and 117 is s-polarized light, and the light incident on the cross dichroic prism 119 from the liquid crystal light valve 116 is p-polarized light. In this way, by setting the light incident on the cross dichroic prism 119 as different types of polarized light, the cross dichroic prism 119 can synthesizes the light incident from each of the liquid crystal light valves 115 to 117. Here, in general, the dichroic films 119a and 119b have excellent reflection transistor characteristics of s-polarized light. For this reason, the red light R and the blue light B which are reflected by the dichroic films 119a and 119b are set as the s-polarized light, and the green light G which passes through the dichroic films 119a and 119b is set as the p-polarized light. The projection optical system 118 includes a projection lens (not illustrated), and is configured to project the light synthesized by the cross dichroic prism 119 onto the screen 111.

Other Projection Type Display Device

A projection type display device may have a configuration in which an LED light source or the like which emits light of various colors is used for a light source unit, and the light of various colors which is emitted from the LED light source is supplied to different liquid crystal devices.

Other Electronic Apparatuses

The electro-optical device 100 to which the invention is applied, may be used as a direct-view display device in an electronic apparatus, such as, a mobile phone, a personal digital assistant (PDA), a digital camera, a liquid crystal television, a car navigation device, a television phone, a POS terminal, or an apparatus including a touch panel, in addition to the electronic apparatus described above.

The entire disclosure of Japanese Patent Application No. 2015-059151, filed Mar. 23, 2015 is expressly incorporated by reference herein.

What is claimed is:

1. An electro-optical device comprising:
a substrate;
a pixel transistor which includes a semiconductor layer extending toward one side of the substrate in a first direction;
a pixel electrode which is provided on a side opposite to the substrate with respect to the semiconductor layer and is electrically coupled to an end on the one side of the semiconductor layer;
a first metal layer with light shielding properties which includes a first wire that extends in the first direction and overlaps the semiconductor layer in a planar view, and a first relay electrode that is separated from one side of a second direction that intersects the first direction from the first wire, and which is provided between a layer of the pixel transistor and a layer of the pixel electrode; and
a second metal layer with light shielding properties which includes a second wire that extends in at least one direction of the first direction and the second direction, and is provided between the first metal layer and a layer of the pixel electrode,
wherein the first relay electrode has an end on the other side of the second direction which is separated from the first wire by a first gap and extends along the semiconductor layer in the first direction,
wherein the second metal layer includes a first light shielding section which overlaps the first gap in a planar view, and
wherein the first metal layer is closer to the semiconductor layer than the second metal layer.

2. The device according to claim 1, wherein the first relay electrode includes a first main body section which extends in the second direction, and a first protrusion section which protrudes along the semiconductor layer in the first direction from the end on the other side of the second direction of the first main body section.

3. The device according to claim 1,
wherein the second wire extends in the first direction and overlaps the first wire in a planar view, and
wherein the first light shielding section includes a first projection section which projects toward the one side of the second direction from the second wire.

4. The device according to claim 1,
wherein the first metal layer includes a second relay electrode which is separated from the first wire toward the other side of the second direction,
wherein the second relay electrode has an end on the one side of the second direction which is separated from the first wire by a second gap and extends along the semiconductor layer in the first direction, and
wherein the second metal layer includes a second light shielding section which overlaps the second gap in a planar view.

5. The device according to claim 4, wherein the second relay electrode includes a second main body section which extends in the second direction, and a second protrusion section which protrudes along the semiconductor layer in the first direction from the end on the one side of the second direction of the second main body.

6. The device according to claim 4,
wherein the second wire extends in the first direction and overlaps the first wire in a planar view, and
wherein the second light shielding section includes a second projection section which projects toward the other side of the second direction from the second wire.

7. The device according to claim 1, wherein the first wire is a data line which is electrically coupled to the end on the other side of the semiconductor layer.

8. The device according to claim 1, wherein both the first metal layer and the second metal layer include an aluminum layer.

9. The device according to claim 1,
wherein a retention capacitor which is electrically coupled to the pixel electrode is provided between the semiconductor layer and the first metal layer, and
wherein an electrode which configures the retention capacitor overlaps the semiconductor layer in a planar view.

10. An electronic apparatus comprising:
the electro-optical device according to claim 1.
11. An electronic apparatus comprising:
the electro-optical device according to claim 2.
12. An electronic apparatus comprising:
the electro-optical device according to claim 3.
13. An electronic apparatus comprising:
the electro-optical device according to claim 4.
14. An electronic apparatus comprising:
the electro-optical device according to claim 5.
15. An electronic apparatus comprising:
the electro-optical device according to claim 6.
16. An electronic apparatus comprising:
the electro-optical device according to claim 7.
17. An electronic apparatus comprising:
the electro-optical device according to claim 8.
18. An electronic apparatus comprising:
the electro-optical device according to claim 9.

* * * * *